US007064617B2

(12) United States Patent
Hein et al.

(10) Patent No.: US 7,064,617 B2
(45) Date of Patent: Jun. 20, 2006

(54) METHOD AND APPARATUS FOR TEMPERATURE COMPENSATION

(75) Inventors: Jerrell P. Hein, Driftwood, TX (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/878,196

(22) Filed: Jun. 28, 2004

(65) Prior Publication Data

US 2004/0232997 A1 Nov. 25, 2004

Related U.S. Application Data

(63) Continuation-in-part of application No. 10/675,543, filed on Sep. 30, 2003.

(60) Provisional application No. 60/467,813, filed on May 2, 2003, provisional application No. 60/567,479, filed on May 3, 2004.

(51) Int. Cl.
*H03L 7/00* (2006.01)

(52) U.S. Cl. ........................................ 331/16; 327/147

(58) Field of Classification Search .................. 331/16, 331/18, 25, 176; 327/105, 147, 156, 162, 327/163; 375/373, 375, 376

See application file for complete search history.

(56) References Cited

U.S. PATENT DOCUMENTS 3,676,801 A 7/1972 Musa ................... 331/116 FE
3,719,838 A 3/1973 Peduto et al. ............... 310/315
3,813,610 A 5/1974 Kimura ...................... 331/1 A
3,887,941 A 6/1975 Dann et al. ................... 386/89
4,038,612 A 7/1977 Borofka et al. ............. 331/178
4,135,158 A 1/1979 Parmet ....................... 455/143
4,380,745 A 4/1983 Barlow et al. ............. 331/176
4,446,446 A 5/1984 Fowks ........................... 331/3
4,485,818 A 12/1984 Leckrone et al. .............. 607/9
4,580,107 A 4/1986 Caldwell et al. .............. 331/10
4,598,257 A 7/1986 Southard ....................... 331/2
4,683,445 A 7/1987 Erickson ...................... 331/25
4,689,581 A 8/1987 Talbot ........................ 331/1 A
4,827,226 A 5/1989 Connell ................ 331/116 FE
4,847,888 A 7/1989 Cox et al. ................... 455/400
4,859,968 A 8/1989 Gershon ...................... 331/38
4,891,825 A 1/1990 Hansen ........................ 377/52
4,931,748 A 6/1990 McDermott et al. ........ 331/1 A
4,940,950 A 7/1990 Helfrick ........................ 331/2
4,967,165 A 10/1990 Lee et al. ................... 331/158

(Continued)

FOREIGN PATENT DOCUMENTS

EP 0 239 412 A2 9/1987

(Continued)

OTHER PUBLICATIONS

De Muer, Bram, and Steyaert, Michel S. J., "A CMOS Monolithic ΔΣ-Controlled Fractional-N Frequency Synthesizer for DCS-1800," IEEE Journal of Solid-State Circuits, vol. 37, No. 7, Jul. 2002, pp. 835-844.

(Continued)

*Primary Examiner*—Linh My Nguyen
(74) *Attorney, Agent, or Firm*—Zagorin O'Brien Graham LLP

(57) ABSTRACT

Temperature compensation is achieved by adjusting a divide ratio of a multi-modulus divider circuit in a feedback path of a phase-locked loop based on the detected temperature. The divide ratio is adjusted based on stored adjustment values stored in non-volatile memory. Interpolation may be used to interpolate between the stored adjustment values.

26 Claims, 12 Drawing Sheets

U.S. PATENT DOCUMENTS 4,969,210 A 11/1990 Hansen et al. .......... 455/188.1
4,996,608 A 2/1991 Widney .......... 331/1 A
5,038,117 A 8/1991 Miller .......... 331/16
5,041,800 A 8/1991 Long et al. .......... 331/69
5,081,431 A 1/1992 Kubo et al. .......... 331/158
5,099,153 A 3/1992 Adams .......... 331/64
5,144,254 A 9/1992 Wilke .......... 327/107
5,179,359 A 1/1993 McLeod .......... 331/38
5,180,992 A 1/1993 Akiyama et al. .......... 331/11
5,233,351 A 8/1993 Gregory et al. .......... 342/100
5,254,958 A 10/1993 Flach et al. .......... 331/10
5,257,294 A 10/1993 Pinto et al. .......... 375/376
5,259,007 A 11/1993 Yamamoto .......... 375/376
5,263,197 A 11/1993 Manjo et al. .......... 455/324
5,266,908 A 11/1993 Koulopoulos et al. .......... 331/2
5,319,324 A 6/1994 Satoh et al. .......... 331/158
5,337,024 A 8/1994 Collins .......... 332/127
5,349,544 A 9/1994 Wright et al. .......... 708/1
5,416,443 A 5/1995 Cranford, Jr. et al. .......... 331/2
5,416,446 A 5/1995 Holler, Jr. et al. .......... 331/57
5,425,074 A 6/1995 Wong .......... 377/47
5,428,319 A 6/1995 Marvin et al. .......... 331/176
5,448,204 A 9/1995 Gardner .......... 331/25
5,451,912 A 9/1995 Torode .......... 331/177 R
5,471,661 A 11/1995 Atkinson .......... 455/165.1
5,473,289 A 12/1995 Ishizaki et al. .......... 331/176
5,473,758 A 12/1995 Allen et al. .......... 771/103
5,485,127 A 1/1996 Bertoluzzi et al. .......... 331/69
5,574,408 A 11/1996 Zwack .......... 331/176
5,579,348 A 11/1996 Walker et al. .......... 375/355
5,604,468 A 2/1997 Gillig .......... 331/176
5,781,044 A 7/1998 Riley et al. .......... 327/105
5,781,054 A 7/1998 Lee .......... 327/231
5,790,614 A 8/1998 Powell .......... 375/376
5,834,987 A 11/1998 Dent .......... 332/127
5,847,611 A 12/1998 Hirata .......... 331/1 A
5,952,890 A 9/1999 Fallisgaard et al. .......... 331/18
6,008,703 A 12/1999 Perrott et al. .......... 332/100
6,044,124 A 3/2000 Monahan et al. .......... 375/376
6,061,418 A 5/2000 Hassoun .......... 377/47
6,091,943 A 7/2000 Nyenhuis .......... 455/260
6,236,703 B1 5/2001 Riley .......... 377/48
6,404,246 B1 6/2002 Estakhri et al. .......... 327/156
6,456,164 B1 9/2002 Fan .......... 331/16
6,509,800 B1 1/2003 Stockton .......... 331/11
6,515,553 B1 * 2/2003 Filiol et al. .......... 332/127
6,570,453 B1 5/2003 Su et al. .......... 331/1 A
6,617,893 B1 9/2003 Born et al. .......... 327/115
6,618,462 B1 9/2003 Ross et al. .......... 377/148
6,670,854 B1 12/2003 Takeda et al. .......... 331/1 A
6,683,932 B1 1/2004 Wood .......... 377/47
6,807,552 B1 10/2004 Bredin et al. .......... 708/103
6,917,317 B1 7/2005 Nagaso et al. .......... 341/131
6,930,519 B1 8/2005 Fallahi et al. .......... 327/115
2002/0140512 A1 10/2002 Stockton .......... 331/11
2002/0190764 A1 * 12/2002 Nichols .......... 327/156
2004/0222856 A1 11/2004 Hein .......... 331/16
2004/0232995 A1 11/2004 Thomsen et al. .......... 331/2
2004/0246809 A1 12/2004 Sutardja .......... 365/232
2005/0068118 A1 3/2005 Hein .......... 331/158
2005/0212570 A1 9/2005 Sun et al. .......... 327/115
2005/0242848 A1 11/2005 Sun et al. .......... 327/115

FOREIGN PATENT DOCUMENTS

EP 0 393 975 A1 10/1990
EP 0 402 736 A2 12/1990
EP 0 601 780 A2 6/1994
EP 1 345 375 A2 9/2003
JP 02-291161 11/1990
JP 03-297223 12/1991
WO WO 85/02966 7/1985

OTHER PUBLICATIONS

Pamarti, Sudhakar, et al., "A Wideband 2.4-GHz Delta-Sigma Fractional-N PLL With 1-Mb/s In-Loop Modulation," IEEE Journal of Solid-State Circuits, vol. 39, No. 1, Jan. 2004, pp. 49-62.

Riley, Tom A. D., et al., "Delta-Sigma Modulation in Fractional-N Frequency Synthesis," IEEE Journal of Solid-State Circuits, vol. 28, No. 5, May 1993, pp. 553-559.

U.S. Appl. No. 11/270,954, filed Nov. 10, 2005, Thomsen et al.

U.S. Appl. No. 11/270,957, filed Nov. 10, 2005, Thomsen et al.

Craninckx, Jan and Steyaert, Michiel S. J., "A 1.75-GHz/3-V Dual-Modulus Divide-by-128/129 Prescaler in 0.7-μm CMOS," IEEE Journal of Solid-State Circuits, vol. 31, No. 7, Jul. 1996, pp. 890-897.

CYPRESS Semiconductor Corporation, "Cypress 1 PLL In-System Programmable Clock Generator with Individual 16K EEPROM," Dec. 14, 2002, 18 pages.

Encinas, J. B., "Phase Locked Loops," Chapman & Hall, 1993, pp. 144-158.

Fox Electronics, "F6233 Quick Delivery Oscillator," 1 page (from file history of US Patent 5,962,890).

Gardner, Floyd M., "Phaselock Techniques," Second Edition, John Wiley & Sons, 1979, pp. 2-5.

Gaskell, Tom, "Semiconductor Circuits Programmable Crystal Oscillator (PX0-600)," Practical Electronics, Jul. 1983, pp. 40-43.

Giles, T. G., "A Universal Frequency Synthesizer IC," Philips Telecommunication Review, vol. 37, No. 3, Aug. 1979, pp. 177-181.

Goto, Junichi, et al., "A Programmable Clock Generator With 50 to 350 MHz Lock Range For Video Signal Processors," IEEE 1993 Custom Integrated Circuits Conference, pp. 4.4.1-4.4.2.

IC Designs, "IC Designs Introduces Trio of Parts Aimed at Replacing Crystal Oscillators in Personal Computer Graphics Board Designs," News Release, May 9, 1990, 1 page.

IC Designs, "Dual Programmable Clock Oscillator," Model No. ICD2051, V2.0, May 1991, pp. 1-12.

IC Designs, "Dual Programmable ECL/TTL Clock Generator," Model No. ICD2062B, prior to 1995, 1 page.

IC Designs, "Frequency Multiplier," Model No. ICD2032 Preliminary Data Sheet, V2.0, May 1991, pp. 1-7.

IC Designs, "Programmable Clock Oscillator," Model No. ICD2053A Programmable Products, V1.0, prior to 1995, 14 pages.

IC Designs, "Satellite Oscillator," Model No. ICD2031A Preliminary Data Sheet, V2.0, May 1991, pp. 1-8.

Krishnapura, Nagendra and Kinget, Peter R., "A 5.3-GHz Programmable Divider for HiPerLAN in 0.25-μm CMOS," IEEE Journal of Solid-State Circuits, vol. 35, No. 7, Jul. 2000, pp. 1019-1024.

Lovelock, Peter A., "Build This Programmable Crystal-Controlled Pulse Generator," Radio Electronics, Jun. 1990, pp. 47-50.

M-Tron, "MT1135 Series Dual Baud Rate Generators," 1987, 3 pages.

Perrott, Michael H., et al., "A 27-mW CMOS Fractional-N Synthesizer Using Digital Compensation for 2.5-MB/s GFSK Modulation," IEEE Journal of Solid-State Circuits, vol. 32, No. 12, Dec. 1997, pp. 2048-2060.

Perrott, Michael H., "Techniques for High Data Rate Modulation and Low Power Operation of Fractional-N Frequency Synthesizers," Dissertation, Massachusetts Institute of Technology, Sep. 1997, pp. 1-199.

PHILIPS Semiconductors, Product Specification Data Sheet, HEF4017B, MSI, 5-Stage Johnson Counter, Jan. 1995.
Sumi, Yasuaki, et al., "Novel Fractional-N PLL Frequency Synthesizer with Reduced Phase Error," Proceedings of IEEE Asia Pacific Conference on Circuits and Systems '96, Nov. 18-21, 1996, Seoul, Korea, pp. 45-48.
Epson, "Programmable Multi-Output Crystal Oscillator MG-5010," Mar. 7, 1993, 3 pages.
Foord, A., "Voltage Controlled Oscillator," Radio & Electronics Constructor, May 1975m pp. 590-595.
Fox Electronics, "1995-1996 Frequency Control Products Catalog," Fort Meyers, Florida, 1995, 72 pages.
Fox Electronics, "F3000 . HCMOS.ITL Tri-State Enable. Disable Oscillator," 1992, 1 page.
Fox Electronics, "F6053A / Tri-State HCMOS Programmable Clock Oscillator," 1993, 4 pages.
Fox Electronics, "F6151 / Tri-State HCMOS Dual Programmable Clock Oscillator," 1993, 4 pages.
Hybrids International, Ltd., "Hybrids International Product Summary," Mar. 1993, Olathe, Kansas, 7 pages.
IC Designs, "Application Note: Power Feed and Board Layout Issues," May 1991, 3 pages.
IC Designs, "Dual VGA Clock Generator," Model No. ICD2042A, prior to 1995, 1 page.
IC Designs, "Graphics Frequency Synthesizers," Model No. ICD2061A, prior to 1995, 1 page.
IC Designs, "Programmable Graphics Clock Generator," Model No. ICD 2063. prior to 1995, 1 page.
IC Designs, Model No. ICD 6233, Specifications, Feb. 11, 1994, 32 pages.
MF Electronics Corp., "Crystal Controlled Oscillators 20 to 220 MHz Programmable ECL," prior to 1995, pp. 9, 11, 18-20.
Mielke, Erhard, "XP-002061415 Programmlerbarer 50-MHz-Muttertaktimulsgenerator," 2421 Radio Fernsehen Elektronik 39 (1990) No. 9, Berlin, 4 pages.
M-Tron, "MV Series VCXO Oscillators," prior to 1995, 1 page.
National Semiconductor, "PLL®Low Power Frequency Synthesizer for RF Personal Communications," Advance Information, Jan. 1998, 18 pages.
OOMS, William J., "Improved Frequency Synthesizer," 8182 Motoral Technical Disclosure Bulletin, Oct. 1986, Schaumbourg, ILL, 3 pages.
Soderquist, Donn, "Digitally Programmed Oscillator is Sultable for μP, Control," Precision Monolithics Inc., (no date), 2 pages.
Vectron Laboratories, "Sonet Clock Recovery Module 622. 08 MHz," Model No. SCRM-622, 1994, 4 pages.
Wenzel Associates, "Custom Oscillator Configurations," Austin, Texas, 1 page.

* cited by examiner

METHOD AND APPARATUS FOR TEMPERATURE COMPENSATION

CROSS-REFERENCE TO RELATED APPLICATION(S)

This application is a continuation-in-part of application Ser. No. 10/675,543, entitled "CALIBRATION OF OSCILLATOR DEVICES", filed Sep. 30, 2003, naming Jerrell Hein and Axel Thomsen as inventors, which claimed benefit under 35 U.S.C. § 119(e) of application 60/467,813, filed May 2, 2003; and this application claims benefit under 35 U.S.C. 119(e) of application 60/567,479, entitled "METHOD AND APPARATUS FOR A PROGRAMMABLE CLOCK SOURCE GENERATING A WIDE RANGE OF OUTPUT FREQUENCIES", filed May 3, 2004, naming Axel Thomsen, Yunteng Huang, Jerrell P. Hein as inventors, which applications are incorporated herein by reference.

BACKGROUND

1. Field of the Invention

This application relates to integrated circuit devices more particularly to temperature compensation in integrated circuits.

2. Description of the Related Art

Clock sources typically utilize a resonator such as a crystal oscillator or surface acoustic wave (SAW) device. Clock sources such as crystal or SAW oscillators (XO/SO) and voltage controlled crystal or SAW oscillators (VCXO/VCSO) are common clock sources. Because the stability of clock signals generated by the XO/SO and VCXO/VCSO devices may be affected by variations in temperature, it is common to adjust the clock output signals provided by such devices based on temperature in order to try and obtain stable outputs over temperature.

Referring to FIG. 1, a prior art temperature compensation technique is illustrated in which a temperature sensor 101 is utilized to detect a temperature. The detected temperature is used to retrieve one or more adjustment values corresponding to the detected temperature in a look up table 103. The retrieved value(s) are processed in an algorithm block 105, e.g., to interpolate the appropriate correction value based on the detected temperature and retrieved adjustment value(s). The correction value is then converted to an analog voltage in the digital to analog converter 107. The analog voltage is then supplied to the summer 111, which also receives a normal voltage control input (not compensated for temperature) on node 112. The summing block 111 supplies the voltage controlled oscillator (VCO) 113 with a control value that is compensated for temperature. The use of the stored adjustment values, allows the device to adjust its VCO output based on temperature to ensure that frequency stability over temperature. In order to initially calibrate the device for temperature, it has been common to store the temperature compensation values in the look up table or other memory structure 103 during manufacture.

It would be desirable to provide an improved temperature compensation scheme to allow devices provide stable clock signals over temperature.

SUMMARY

Accordingly, temperature compensation is achieved by adjusting a divide ratio of a multi-modulus divider circuit in a feedback path of a phase-locked loop based on the detected temperature. In one embodiment, an integrated circuit is provided that includes a phase-locked loop circuit including a divider circuit in the feedback path of the phase-locked loop; and wherein a control value supplied to control the divider circuit is adjusted according to a detected temperature.

In another embodiment a method is provided for temperature variation in an electronic device that includes detecting a temperature and modifying a feedback portion of a phase-locked loop according to the detected temperature to adjust an output of the phase-locked loop and thereby compensate for the temperature variation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
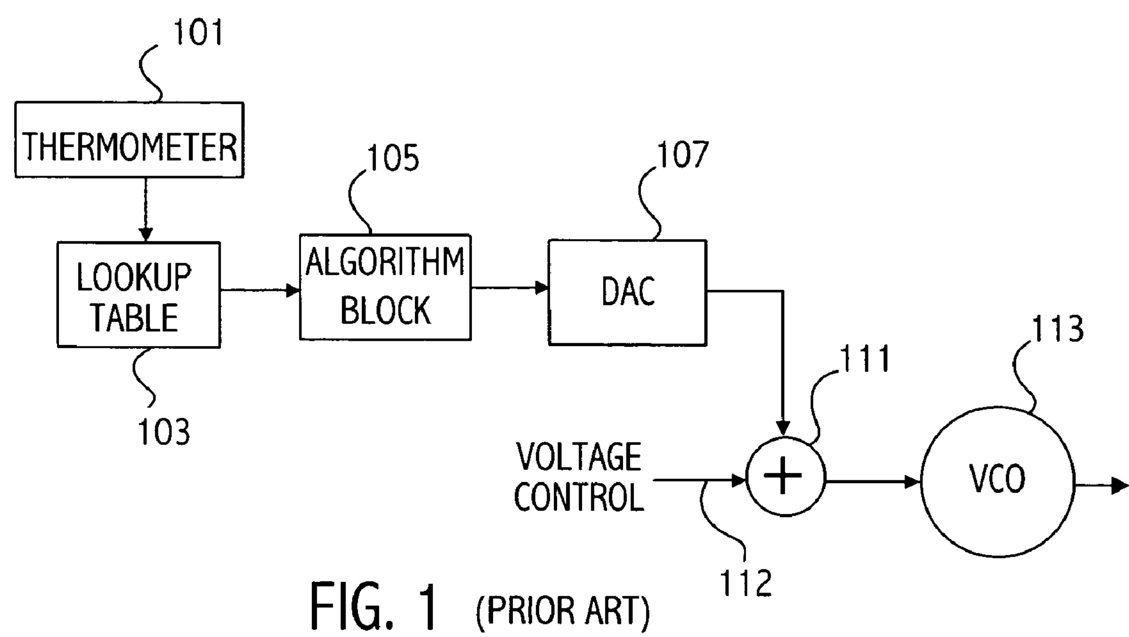
FIG. 1 illustrates a prior art temperature compensation scheme.
Figure 2A:
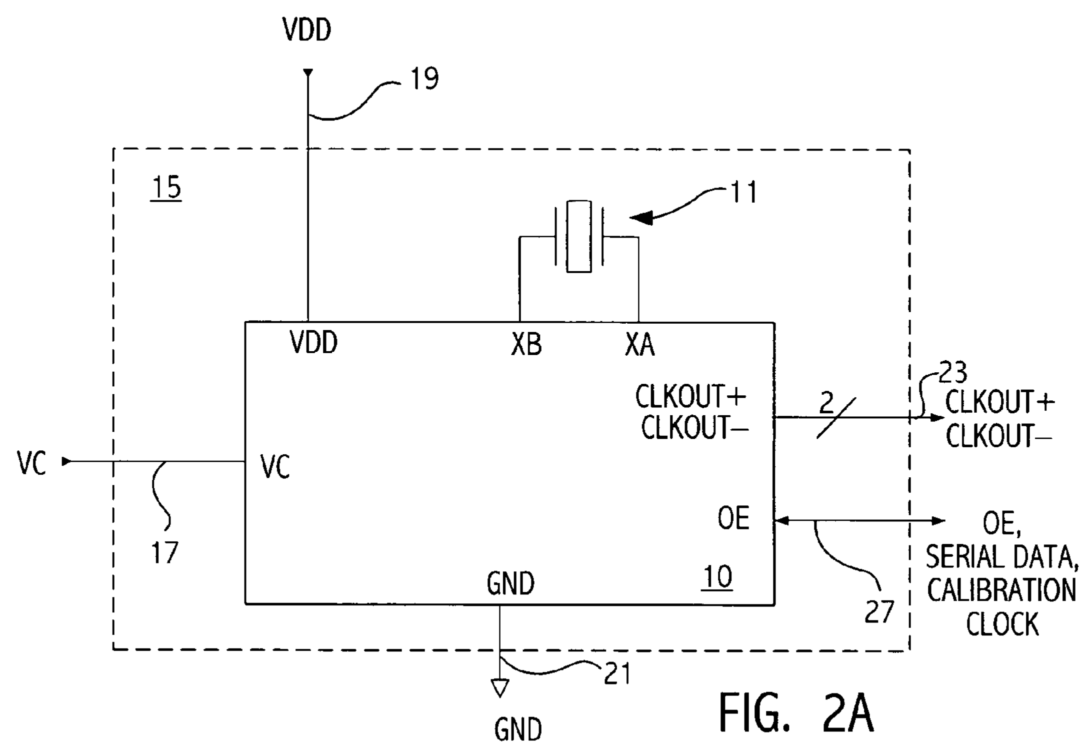
FIG. 2A illustrates a device in which an integrated circuit and a crystal are packaged in a standard six pin VCXO ceramic package.
Figure 2B:
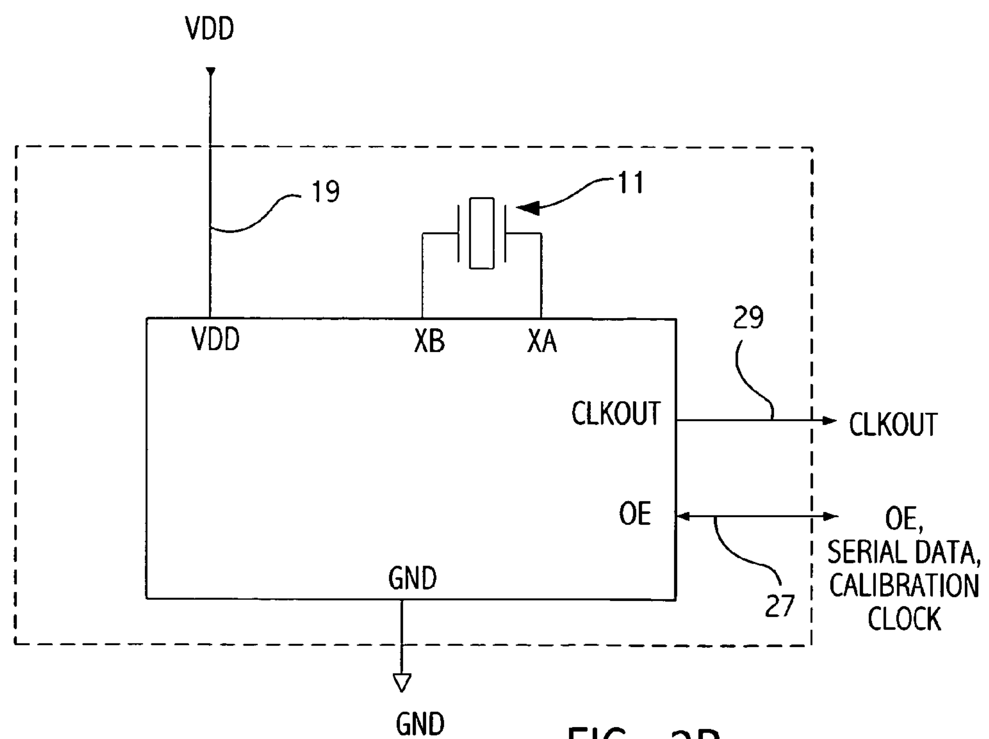
FIG. 2B illustrates a device in which an integrated circuit and a crystal are packaged in a standard four pin XO ceramic package.

Referring to FIG. 2A, a high level diagram shows a clock source device that includes an integrated circuit 10 coupled to a crystal 11. In one embodiment both the integrated circuit 10 and the crystal 11 are packaged in a standard ceramic package 15 that is typically utilized for packaging a voltage controlled crystal oscillator (VCXO). Note that another resonating device such as a surface acoustic wave (SAW) resonator may be utilized in place of crystal 11. In the illustrated embodiment, the package 15 includes standard input/output signals including a voltage control input 17, a power and ground input, 19 and 21 respectively, differential clock outputs and an output enable (OE) pin 27. FIG. 2B illustrates a four pin XO package implementation in which the control voltage input 17 is not utilized and the output clock 29 is single ended. A six pin XO package configuration may also be utilized in which the control voltage input on the package is not connected when the package 15 is mounted to a board. Other packaging alternatives for the integrated circuit with or without the crystal oscillator or SAW may also be utilized.

Figure 3:
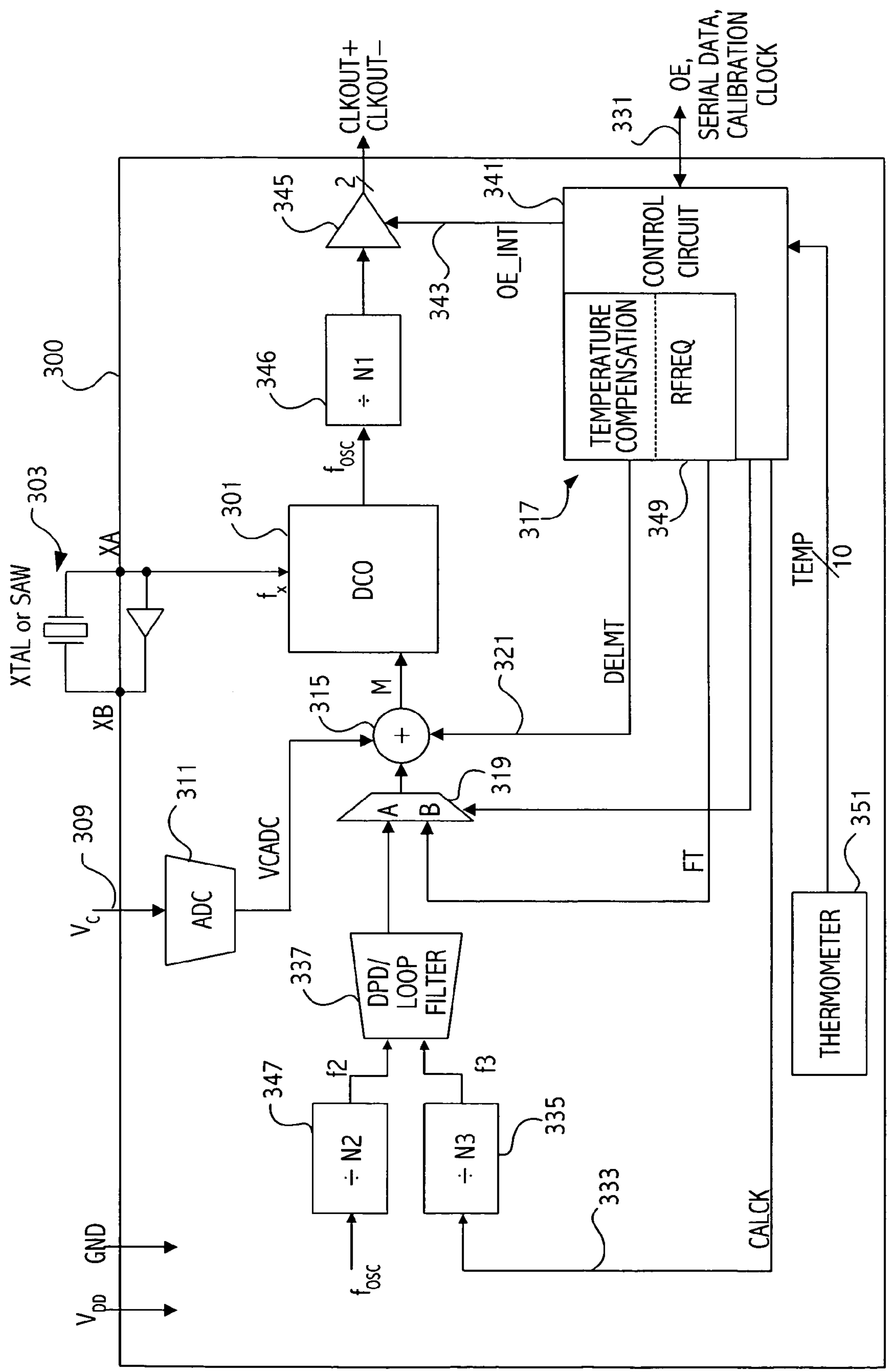
FIG. 3 illustrates a block diagram of an exemplary integrated circuit suitable for use as the integrated circuit in FIG. 1 or 2.

Referring to FIG. 3, a block diagram illustrates an embodiment of integrated circuit 10 that provides a fixed frequency or voltage controlled clock source. In FIG. 3, the integrated circuit is packaged in a six pin VCXO package. Integrated circuit 300 includes a digitally controlled oscillator (DCO) 301. With the use of a fractional N phase-locked loop (PLL), a crystal based reference clock 303 can be multiplied up by a rational number to supply a wide variety of output frequencies. The fractional N loop can be viewed as a digitally controlled oscillator, where the output frequency is controlled by the rational digital number M according to Fout=M×Fref. Thus, the DCO 301 can be implemented as a fractional N PLL providing a wide range of output frequencies output $f_{osc}$=M×$f_x$, where $f_x$ is supplied from oscillator 303. The precision of M can be to the level of a few parts per billion. An important criteria is to ensure that a DCO, such as illustrated in FIG. 3, meets the phase noise specifications typically achieved by a fixed frequency crystal or SAW based oscillator. A standard of interest would be for example the SONET standard for jitter generation. That will be explained in more detail below.

Fractional N phase-locked loops (PLLs) allow the multiplication of an incoming reference clock by a rational rather than an integer number as is common in traditional PLL designs. Such a multiplication requires the use of a multi-modulus divider in the feedback path. Such a divider will divide not by a fixed integer, but by a sequence of integers that over time approximates the rational number desired. This sequence can be generated by a digital delta sigma modulator which shapes the quantization noise added to the rational number with a high pass filter. Thus the resulting phase noise is also shaped by a high pass filter. The overall noise contribution from the fractional PLL depends on two major factors. The first major factor is the ratio of the update rate of the PLL (generally the reference clock rate) and the loop bandwidth of the PLL, a measure similar to the oversampling ratio (OSR) in delta sigma analog to digital converters (ADCs). A higher OSR allows for better suppression of quantization noise in the band of interest. For a given update rate the noise contribution can be reduced by lowering the loop bandwidth. The second major factor contributing to noise is the quantization error applied at the divider, which is the clock period of the clock feeding the multi-modulus divider.

Additional to the noise sources stated above, noise in a PLL has 2 other main contributors: The first other main contributor is noise from the voltage controlled oscillator (VCO). An integrated LC VCO exhibits 3 noise regions, close in $1/f^3$, intermediate $1/f^2$, and high frequency white noise that is frequency independent. For example, exemplary corners defining the three regions are at 100 KHz and 100 MHz. For an integrated LC VCO oscillating in the GHz range, the $1/f^3$ region is significant, whereas the white noise region is insignificant. When embedded in a PLL the noise transfer function to the output of the PLL is a high pass filter with a corner at the loop bandwidth. Wider loop bandwidth improves the noise contribution from the VCO. If the bandwidth of the loop exceeds the 1/f corner of the oscillator, the overall phase noise performance tends to be very competitive with the performance of prior art fixed frequency crystal or SAW based oscillators in applications such as SONET.

The second other main contributor to noise in a PLL is noise from the reference clock. Similar noise regions exist as above. If this clock is generated from a fixed crystal oscillator, it is generally very competitive at low frequency ($1/f^3$ and $1/f^2$) but with a significant white noise contribution. Narrower loop bandwidth improves the noise contribution of this source.

The choice of loop bandwidth is an optimization to reduce noise from various sources. Given today's state of the art in LC oscillator design in terms of phase noise and oscillation frequency, and the ability of a state of the art CMOS process to implement a high speed multi-modulus divider and a high speed delta sigma modulator, it is now possible to optimize the noise budget to yield a clock source that can exceed standards such as SONET and to enable this architecture as a clock source.

Good jitter performance of the DCO loop is facilitated by implementation of the loop filter as a digital filter, which is a technique that allows an accurate implementation of the loop filter that is properly matched to the corners and the order of the noise shaping function and therefore can best reduce the jitter contribution from that source. Digital loop filter implementations are known in the art and described, e.g., in U.S. Pat. No. 6,630,868, entitled "Digitally Synthesized Loop Filter Circuit Particularly Useful for a Phase Locked Loop", published as Published application No. 20020089356 A1, Jul. 11, 2002, naming Perrott et al. as inventors, which are incorporated herein by reference.

Additionally the current phase error can be computed as the integral of all instantaneous frequency errors as they were computed in the delta sigma modulator that controls the multi modulus divider. Through subtraction in the analog or digital domain, the phase error can be cancelled and thus strongly reduced as a noise source. As a result the bandwidth can be increased and thus overall better jitter performance can be achieved.

The device illustrated in FIG. 3 can function as a voltage-controlled crystal oscillator (VCXO/VCSO) or as a fixed-frequency clock source (XO/SO). A register bit setting may be used to select between the modes of operation. In voltage-controlled oscillator operational mode a control voltage is received on the VC analog voltage input port 309. The on-chip analog to digital converter (ADC) 311 converts the control voltage VC into a digital control word (VCADC) supplied to summing circuit 315, which generates the control signal M for the DCO 301. When operating in VCXO/VCSO mode, the selector circuit 319 selects input B, which is coupled to the reference frequency (RFREQ) control value stored in a portion 349 of non-volatile storage 317. The control value from the selector circuit may be summed in summing circuit 315 with a temperature compensation value (DELMT) supplied on node 321 as described further herein, as well as with as the control VCADC, and the sum is supplied to DCO 301 as the control signal to determine the DCO output. In VCXO/VCSO mode the RFREQ provides a center frequency that is adjusted by VCADC. If temperature compensation is not used, a value for DELMT is selected so as to not affect the output of DCO 301. Note that while 315 is shown in the block diagram as a summing circuit, some embodiments may utilize other arithmetic circuits to appropriately combine the various control values that are used to form the control signal M for DCO 301. For example, in one embodiment, the signals are combined using a multiplier circuit in which the center frequency provided by RFREQ is scaled appropriately by VCADC and/or DELMT using a multiplier circuit.

When operating as a fixed frequency clock source, the selector circuit also selects 319 input B, to supply the reference frequency (RFREQ) control value stored in a portion 349 of non-volatile storage 317. That control value may be summed in summing circuit 315 with a temperature compensation value (DELMT) supplied on node 321. The sum from summing circuit 315 is supplied to DCO 301 as the control signal to determine the DCO output. When operating as a fixed-frequency clock source (XO/SO), the ADC 311 is powered down and its output is fixed to its mid-scale value so as not to affect the DCO 315.

The use of a DCO as a clock source has several advantages. Digital control of the output frequency allows for storage of calibration parameters in non-volatile memory 317. Also, the DCO can be embedded in an outer phase locked loop as described further herein. This outer loop includes a phase detector with digital output and a digital loop filter 337 and the DCO 301. When the outer loop is in lock to a reference frequency, the value present at the input to the DCO 301 is the proper multiplier to achieve this frequency in an open loop operation. Therefore this value can be stored while in lock and recalled later for operation in open loop as a clock source. The loop bandwidth of the inner loop, as described above, is preferably greater than the 1/f corner. Depending on specific implementations, the loop bandwidth of the inner loop may range from approximately 10 KHz to approximately 10 MHz. The loop bandwidth of the outer loop is preferably much lower, e.g., below approximately 1 KHz and may be less than or equal to 50 Hz or lower. Note also that the inner loop is implemented to adjust quickly to changes as compared with the outer loop. Having a low bandwidth outer loop allows attenuation of jitter present on the reference clock input, which in turn can reduce jitter present in a stored control value to control the output of the inner loop.

The embodiment illustrated in FIG. 3 has the capability of generating and storing a digital control value for DCO 301 corresponding to a clock signal received via a calibration input. In that way, the device can be programmed to provide a clock having a desired output frequency. When operating in calibration mode, as described further herein, a calibration clock signal is supplied, e.g., on terminal 331 and via signal line 333 to divider 335. The calibration clock is compared to the output of the DCO 301 in phase and frequency detector 337 and an error signal is generated and filtered and supplied to adjust the output of DCO 301. When the output of the DCO has locked to the supplied calibration clock, the value of M may be stored. The calibration clock feature is useful, e.g., so that the device can lock its output clock to the calibration clock using an internal PLL, and control factors used to lock the PLL to the calibration clock can be stored for absolute output frequency and/or frequency versus temperature, as described further below. That stored value may then be utilized to control the DCO during normal operation.

In order to supply the calibration clock and perform necessary programming associated with configuring the clock source, a communication port, e.g. a serial port may be provided. The serial port may be provided as a dedicated programming port or its function can be combined with other I/O terminals. For example, in order to provide a more flexible clock device, according to one embodiment, the OE pin 331 is multi-functional. That is, in one embodiment, the OE terminal functions as a normal enable signal causing the output clock(s) to be either supplied or not according to the voltage level on the OE terminal. In addition, according to an embodiment of the present invention, the OE terminal 331 is also used for programming and calibrating the device 300. In order to program the integrated circuit device, the OE terminal 331 is used to communicate serial data to and from the integrated circuit 300 and used to supply a calibration clock. Thus, in addition to normal enable/disable functionality, the OE pin 331 may serve as a serial port for access to storage locations internal to integrated circuit 10, thus providing programmability. In an embodiment, the OE pin is bi-directional, implemented as an open drain with a weak pull-up. In some embodiments, the serial communication may be unidirectional into integrated circuit 330. In addition, OE terminal 331 can function as a calibration clock input used to internally generate calibration correction factors using an internal PLL.

Adapting the OE terminal to be multi-functional provides both programmability and calibration capability, and because a standard input terminal is utilized for the functions, no special packaging is required, resulting in low cost for the additional functionality. Significantly, the functions can be performed after the device is packaged and sealed. In addition, low frequency test equipment can be used to provide programming and calibration of the devices in a sealed package without any additional package pins.

In the illustrated embodiment, the output enable (OE) terminal 331 is multi-functional in that in can be used both to provide an output enable function and to provide programming and calibration clock. The multifunction capability of OE terminal 331 may be provided as follows. The output enable signal supplied from an external source to OE terminal 331 is provided to control circuit 341, which may include a sampling circuit and a state machine. The control circuit 341 determines whether the received signal is a valid output enable signal, serial data communication, or a calibration clock. If the signal on OE terminal 341 is determined to be a valid output enable signal, then the signal value on OE pin 331 is utilized to generate an internal output enable control signal 343, which in turn enables (or disables) output drivers 345 that supply the differential clock outputs CLKOUT+ and CLKOUT−.

In one embodiment control circuit 341 determines whether the signal present on I/O terminal 331 is a valid output enable signal, serial data, or a calibration clock as follows. An internal oscillator clock asynchronously oversamples the OE I/O terminal. Any static value (all samples having the same value) that persists more that a predetermined time period, $t_{STATIC}$, is interpreted as a change to or as a valid enable/disable signal and the output clocks are selectively enabled or disabled based on that static value. The time period $t_{STATIC}$ may be programmable. The sampling circuit functions as a deglitching circuit ensuring that short term changes on I/O terminal 331 do not cause changes to the enable/disable control of the output clock terminal(s).

In order to provide bi-directional data communication via I/O terminal 331, a bi-directional serial data format is utilized that includes guaranteed transitions at less than $t_{STATIC}$ intervals. In one embodiment, the serial data format includes an indication of read or write, the register or other internal address, and direction (either data input or output). Because transitions of the serial communication are guaranteed at less than $t_{STATIC}$ intervals, activity on the OE I/O terminal for serial data I/O will not interfere with the normal enable/disable functionality. In addition, a serial data format is selected that is sufficiently complex, e.g., with appropriate error detection capability, to preclude the possibility that a glitch at the OE terminal during normal operation would be inadvertently interpreted as a serial port command.

In order to distinguish between calibration clocks and serial data, a serial data command is utilized that indicates to the device that the calibration clock will be applied next. That command enables the calibration PLL. After this command, the user supplies a clock to the OE terminal 331. The frequency of the calibration clock may be low even though the output frequencies are high due to the use of the divider 347 in the feedback path from the oscillator 301. Note however, that the frequency of the calibration clock should be high enough to provide transitions at less than $t_{STATIC}$ intervals so as not to interfere with the normal enable/disable operation.

Figure 4:
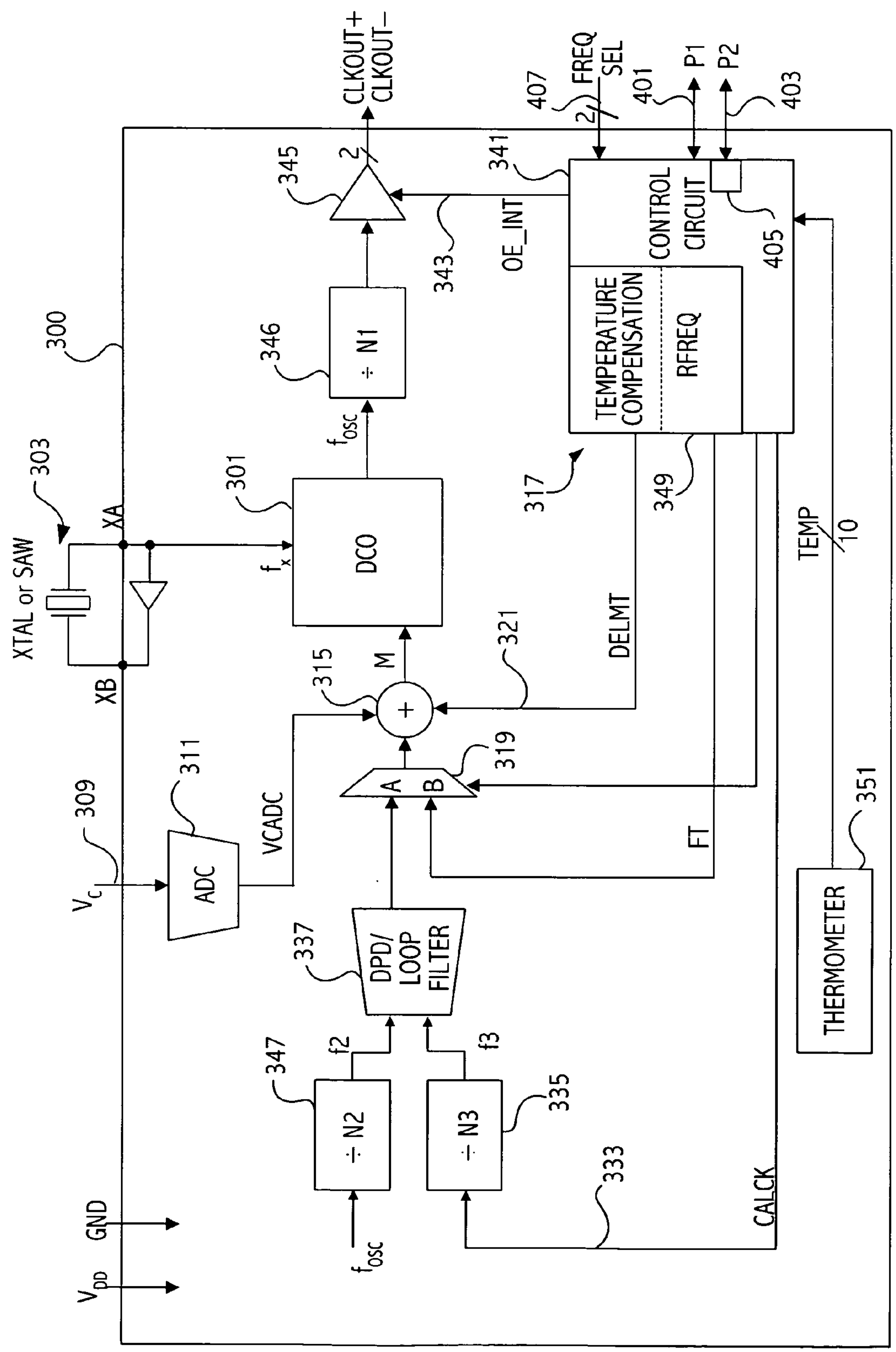
FIG. 4 illustrates alternative serial communication terminals for programming and for receiving a configuration clock according to an embodiment of the invention.

Referring to FIG. 4, in another embodiment the option is provided for using one of two dedicated I/Os on the integrated circuit device. The P1 port 401 is a dedicated I/O that functions as a bidirectional serial port for register data reads and writes, and as a calibration clock input, similar to the function of the OE pin used for programming and calibration described above but without any OE pin functionality. The P2 port 403 is also a dedicated I/O with the same serial bus and calibration clock functionality as P1; however, once programming is completed, P2 can be converted from a dedicated serial port I/O to an input control for the output enable function.

Similar to the OE pin described in relation to FIG. 3, an input deglitching circuit 405 guarantees that short term glitches or pulses on the P2 pin are ignored and do not affect the internal buffer disable control. The length of the deglitch interval, also referred to herein as ($t_{STATIC}$) may be programmable via programmable register bits, e.g., by programming the number of consecutive samples required for validation. In one embodiment, the number of samples varies between 1 and 1024. Similar to operation of output terminal 331 described above, all samples of the P2 input should have the same value for the entire duration of the deglitch interval before the state is validated and reflected at the internal buffer control. In one embodiment, the sample clock rate for the deglitch circuit is approximately 10 MHz (fsamp=fosc/512).

Figure 5:
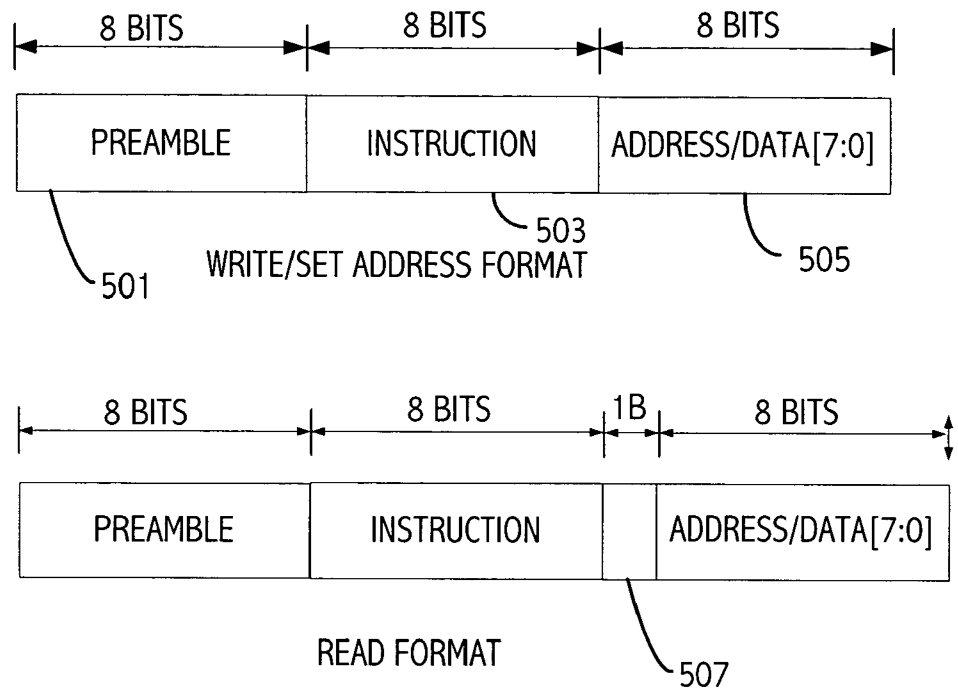
FIG. 5 illustrates exemplary read and write formats utilized for communicating over a serial port.

The serial port is typically used during manufacture test to establish the desired device configuration in the on-chip non-volatile memory (NVM) 317. Serial port communications can begin following a power-on-reset of the device. An exemplary command format for the serial bus is shown in FIG. 5. Each transmission has three eight bit bytes of data: the preamble byte 501, the instruction byte 503, and the address/data byte 505. One extra clock cycle 507 exists for the Read command in order to allow time for placing the transmit output of the test equipment hooked up to the device in high impedance before the first read bit is sent by the device. The serial port state machine, which may be part of deglitching circuit 83, returns to its initialized condition if any invalid input data is detected or if no activity occurs on the bus. That feature guarantees that the state machine can always be brought to a known condition before signaling begins. In one embodiment, all data sent from the test equipment (master) to the device (slave) is Manchester encoded with a symbol rate of approximately 10 kbps. The Manchester encoding creates guaranteed transitions in the data pattern that are used by the device to determine the master's transmission rate. In an embodiment, read data sent from the device to the test equipment is in a non-return to zero (NRZ) format, which maximizes the available sampling time for the test equipment master. The test equipment master can sample the read data using the same internal clock used to generate the transmit data.

Figure 6:
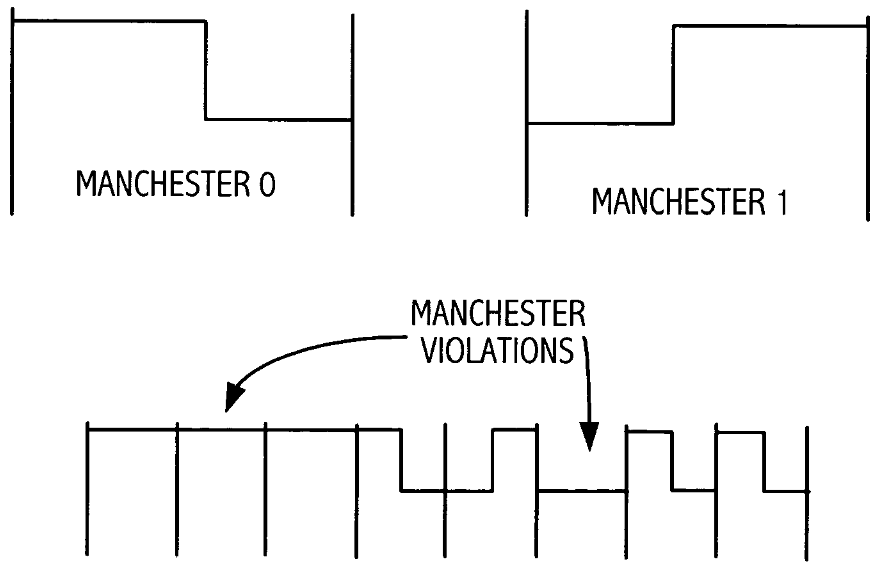
FIG. 6 illustrates exemplary use of Manchester encoding for data supplied over the serial port.

FIG. 6 gives illustrates a Manchester encoded "0" and "1" and also shows the required preamble data pattern. Note that the preamble contains multiple Manchester code violations in order to increase its uniqueness and reduce the chances of false preamble detection.

In still other embodiments the voltage control input 309 may be used as a serial communication port.

Referring again to the embodiment illustrated in FIG. 3, the digitally-controlled oscillator (DCO) 301 is driven by a digital frequency control word M and produces a low jitter output clock. The control word M supplied to the DCO 301 is generated by summing (or multiplying as described above) a reference frequency control word (RFREQ) with the VCO ADC 311 output (VCADC), if utilized, and the temperature compensation value (DELMT), if utilized in summer 315. The fixed frequency external crystal 303, SAW, or clock provides a low jitter reference needed to synthesize the output clock. In one embodiment frequency synthesis is done digitally, eliminating sensitive noise entry points.

In one embodiment different calibration approaches with increasing levels of accuracy may be utilized. For some applications, the inherent frequency accuracy and temperature stability of the crystal oscillator, SAW oscillator, or external reference clock may be sufficient. In this case, no calibration features are needed. A register bit may be used to disable calibration correction features, in which case the temperature compensation (DELMT) value is forced to mid-scale so as not to effect the digital control word supplied to DCO 301.

In some applications it may be adequate to perform a one-time characterization of the device with the crystal or SAW type being used, deriving a set of nominal calibration correction factors from this characterization. Following the characterization, these calibration factors may be loaded into the memory of every device without individual calibration. This approach requires some time initially to generate the nominal calibration factors but does not require calibration of each device.

Alternatively, it is possible to individually calibrate each device, generating a unique set of calibration factors for each one. That approach addresses errors due to the performance parameters of each combination of the device and crystal or SAW. The highest level of error reduction is achieved at the cost of increased test time. Individual calibration is most feasible when each device and crystal or SAW is mounted and packaged together and then tested after packaging.

In one embodiment, the method for frequency and temperature calibration of the DCO uses an external calibration clock applied at the serial port. In calibration mode, a digital phase locked loop (PLL) is implemented around the DCO, locking the DCO output clock to an integer multiple of the low frequency input calibration clock. Once the calibration clock is applied, the device internally generates the required calibration correction factors to generate the desired output frequency.

With reference to FIGS. 3 and 4, calibration according to an embodiment of the invention operates as follows. First the temperature compensation DELMT (delta M over temperature) is turned off. That forces its contribution to summing circuit 315 to 0. If desired it may be enabled after the calibration is complete. If the device is being used as a VCO, VCO mode should be enabled and the analog input $V_c$ 309 should be set to its mid-scale voltage during the calibration.

That sets the analog to digital converter 311 at midrange. If the device is being used as a fixed frequency oscillator, VCO mode should be disabled to cause the output of the ADC 311 to be at midscale and thus not affect the output frequency. Next the calibration clock frequency range should be selected by selecting the N3 divider value for divider 335. In one embodiment, there are two possible frequency ranges for the calibration clock. A register bit can be used to select the range from 1 to 2 MHz, (the divider value=1). To select the range from 8 to 16 MHz, the input divider N3 is set to a divider value to 8. The choice of calibration clock frequency range is based on the availability of precision clock sources in the manufacturing test environment. Other embodiments may have different values for the divider block N3 or lack the divider block entirely.

The values for dividers 335 (N3), 347 (N2), and 346 (N1), and the high speed divider (HS_DIV) (see FIG. 8) should be selected along with the calibration clock frequency. The equation relating the calibration clock frequency to the output frequency is as follows for one embodiment of the invention.:

$$f_{OUT}=f_{CALCK}\times N2/(HS\_DIV\times N1)\text{(for } N3=1\text{), or}$$

$$f_{OUT}=f_{CALCK}\times N2/(8\times HS\_DIV\times N1)\text{ (for } N3=8\text{),}$$

where HS_DIV=[4, 5, 6, 7, 9, 11], $1\leqq N1\leqq 2^7$ and N2=256, 512, 1024 Other embodiments may provide other divider values, additional or fewer dividers and thus have different equations for determining the output frequency.

In some embodiments, the calibration loop bandwidth is also selectable. In one embodiment two choices for calibration loop bandwidth are available, which are selected according to a register bit. The wider bandwidth provides faster settling time, but allows more of the calibration clock phase noise to affect the absolute frequency accuracy when the DPLL is frozen. The lower bandwidth has slower settling, but less variation in the absolute frequency value when the DPLL is frozen. The optimal choice is a function of the calibration clock jitter and the absolute frequency accuracy requirement for the application.

Figure 7:
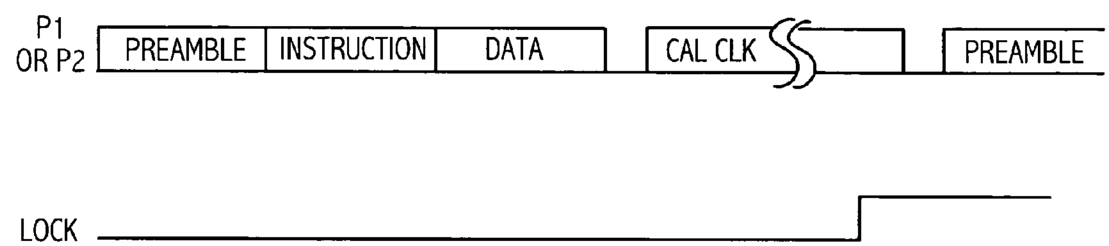
FIG. 7 illustrates exemplary use of a calibration clock over the serial port.

Referring to FIGS. 3, 4, and 7, the control circuit 341 then receives a command setting the calibration clock on (CCK_ON) register bit to one through a serial port register write, indicating that a calibration clock is to be supplied over the serial port. Subsequently, the calibration clock can be supplied as an input frequency reference for the calibration PLL. FIG. 7 illustrates a command sequence including a preamble, write command and data followed by application of the calibration clock. In response to the write command, the control state machine selects multiplexer input A from the digital phase detector and loop filter 337, which forms a phase-locked loop with DCO 301 in this configuration. The calibration clock (CALCK) is supplied via node 333 to the divider circuit 335. The digital phase detector and loop filter 337 detects the phase/frequency difference between the calibration clock and the output of the DCO 301 and provides a correction signal to summer 315 through multiplexer 319 to adjust the control signal M supplied to the DCO 301 to reflect that difference. The calibration clock is applied for sufficient amount of time to allow the PLL to settle and establish the control factors needed to lock the DCO 301 output clock to an integer multiple of the low frequency input calibration clock. In other embodiments the DCO may lock to a fractional multiple (e.g., a ratio of integers) of the calibration clock according to the dividers utilized. Note that because of the divider 347 in the feedback path of the PLL, the calibration clock can be a low frequency signal even for those devices with high speed output clocks. Note that control operations associated with calibration, e.g., to select the multiplexer input and store the value of M, may be controlled via commands sent to serial port, the result of internal control generated by, e.g., a state machine in control circuit 341, or both.

Once the PLL is locked and settled the calibration clock is stopped as shown in FIG. 7. That causes the internal state of the device to be stored and the CCK_ON bit is automatically reset to zero. The cessation of the clock is detected by the control circuit 341 causing it to freeze the correction or control values internally. If the delay required to detect the cessation of the clock allows the PLL to be disturbed before the control values are stored, a history of the control values can be kept on-chip and the control values that existed before the actual clock cessation can be kept. The values that are stored may be the correction factor generated by the phase detector and loop filter 337 or the value of M when the PLL is locked to the calibration clock (essentially the same as the correction factor but after the summing circuit 315). To avoid any inaccuracies in the frozen register values due to the loss of clock detection delay, a running history of the values is kept and the values that existed immediately before the loss of clock are stored when the PLL is frozen. The running history may be stored in registers in the control circuit 341. The control value(s), along with appropriate divider values, can be stored in the non-volatile memory 317, which may, e.g., be implemented as an EPROM, EEPROM, or any other suitable non-volatile memory. The stored control value is used to generate the control value supplied to the DCO 301 by supplying the control value to summing node 315 during normal operation.

In one embodiment a lock detection mechanism is included for the calibration PLL. A lock detect bit (LOCK) is the result of an analysis of the PLL phase detector output. A retriggerable one-shot is set each time the phase detector output indicates a full-scale condition (phase cycle slip). The retrigger time of the one-shot may be programmable via a register bit. Therefore, if no cycle slip has occurred for the retrigger time, the internal lock detection indicator bit (LOCK) is set to one, indicating that the PLL is in lock. The internal lock detection indicator bit (LOCK) can be queried to verify that the PLL achieved lock during the time the calibration clock was active.

Once the calibration clock has ceased for a sufficient amount of time defined by a predetermined time period, the internal over sampling state machine returns to its reset or initialization state, waiting for further activity on the serial port, and ready to receive additional commands. This timeout feature prevents lockup of the state machine, guaranteeing a known starting condition for the user.

Note that the serial communication capability available through input/output terminal 331 also allows a user to program a fixed control value to set oscillator 301 to a specific output frequency by writing to reference frequency storage location 349, supplying that value to the multiplexer 319 and selecting the B input of the multiplexer 319 to be supplied to the summing circuit 315. Additionally, in some embodiments, the divider ratios in some or all of divider blocks may be written and/or read via the serial port provided by input/output terminal.

Note that calibration can also be performed without a calibration clock input. However, that requires multiple serial data writes to the device to set the digital control value supplied, e.g., through summing circuit 315 so that while the control voltage Vc is centered, the clock out signal matches the desired output clock frequency. By instead using a calibration clock supplied over the serial port, the device can itself find the desired correction value by locking its PLL to the calibration clock.

The on-chip nonvolatile memory (NVM) 317 provides for permanent storage of device configuration settings and calibration settings at manufacture. The NVM memory space includes bits for all of the settings necessary to fully configure the device. The volatile memory space includes duplicate bits for each NVM bit, plus additional bits that do not require nonvolatile storage. In one embodiment, the non-volatile memory is one time programmable. A primary (M1) and secondary (M2) NVM space may be provided to allow the NVM settings to be written twice during the lifetime of the device. A status register may be used to indicate the current status of M1 and M2. Data is written from volatile memory, such as registers, into NVM using the STORE command. All volatile memory bits with duplicates in the NVM space are written with one command. The first time the STORE command is executed, the M1 NVM space is written. When the write is initiated, a status bit (M1_WR) is permanently set. Once the write is completed, STORE is reset to zero, a read of M1 is done, and the result is compared to the volatile memory settings. If there is a match, then the NVM write has been successful and the M1_CHK status bit is permanently set. The next time the STORE command is executed, the M2 NVM space will be written. After device powerup or reset, the NVM status bits are checked and the appropriate NVM memory space downloaded into the volatile memory. The appropriate NVM space may also be downloaded on command using the RECALL register bit. Once the download is complete, RECALL is reset automatically.

Upon power up, the device internally executes a power on-reset (POR) which resets the internal device logic, loads the various settings stored in the non-volatile memory into volatile memory (e.g. the various control registers), and places the device output into high impedance. A register bit may also be used to initiate a reset.

In one embodiment, the center frequency of the device is determined by the reference frequency (RFREQ) supplied to the DCO as control input M and the HS_DIV (see FIG. 8) and N1 output divider values. In one embodiment the device has the capability of storing four unique sets of RFREQ, HS_DIV, and N1 values representing four unique selectable output frequencies. There need not be a relationship between the four frequencies desired. That feature is useful in applications where a different output frequency is required depending on the system configuration. The FRQSEL[1:0] inputs 407 (FIG. 4) select which set of RFREQ, HS_DIV, and N1 values are used. If this feature is not desired, the FRQSEL[1:0] pins can be left floating, in which case default values are selected.

Note that the devices illustrated in FIGS. 3 and 4 can provide temperature compensation. That compensation is achieved by supplying the appropriate compensation value determined according to one or more values stored in non-volatile memory 317, which are selected based on the temperature detected by thermometer 351. Calibration for temperature compensation involves generating digital correction factors for various temperatures of interest.

In one embodiment temperature compensation values are determined as follows. First a reference temperature point is determined. The calibration at this temperature sets the RFREQ value to the DCO and all other temperature/frequency points are calculated with respect to this reference point. The reference temperature does not have to be the nominal ambient temperature of operation. To establish the reference temperature calibration point, a temperature calibration point register (TCP[2:0]) is set to 000, FRQSEL[1:0]=11 (if that feature is provided), and the device is brought to the desired reference temperature. The calibration clock is then applied through the serial port. When the clock is stopped, the M value corresponding to the frozen frequency and the temperature value are stored in the RFREQ_11 and RTEMP RAM registers, respectively. The stored values of M and the temperature are the values that existed immediately before the clock was stopped to avoid any glitches that might occur after the calibration clock is stopped.

To generate the calibration points across temperature, after establishing the reference temperature calibration point, TCP[2:0] is set to 001 to indicate the next temperature calibration point is being established, and FRQSEL[1:0] is set to 11, and the device is brought to the desired temperature. The calibration clock is applied as described previously. When the clock is stopped, the frozen delta-frequency value (relative to RFREQ_11) is stored in a DELMT1 register. The frozen delta-frequency value=(M at the reference temperature)−(M at the next temperature calibration point). The associated temperature is stored in the TEMP1 register. For each additional temperature calibration point, the temperature calibration point register is incremented and the calibration clock is reapplied at the desired temperature, and the new frozen delta-frequency value is stored along with the corresponding temperature. The temperature and delta M values are subsequently stored in non-volatile memory. During operation the M value at the reference temperature is used when the thermometer 351 indicates the reference temperature and appropriate offset (supplied as DELMT) are supplied according to the temperature detected by thermometer 351. In other embodiments, the value of M at the particular temperature is stored, rather than delta M, and that value is supplied for temperature compensation.

In one embodiment the device can store up to six calibration points (frequency and temperature pairs), including the reference point, to calibrate the device across temperature. In normal operation with the temperature compensation feature turned on, the device interpolates between the provided stored calibration points using a polynomial of order N−1, where N is the number of calibration points to be used, which in one embodiment is programmable using register bits. For example, if values are written into RFREQ_11, DELMT1, DELMT2, and DELMT3 while DELMT4 and DELMT5 are not to be used, the user set N=4 so that a 3rd order polynomial interpolation is used. Implementations of such polynomials to achieve the interpolation described herein are well known in the art.

As illustrated in FIG. 4, and described above a multi-frequency feature is available using the frequency select inputs FREQSEL[1:0]. If the multi-frequency feature is used, establishing the correct M value for the additional frequencies is achieved by holding the device at the reference temperature, setting FREQSEL[1:0]=10, and reapplying the calibration clock at the appropriate frequency. When the clock is stopped, the frozen frequency control value is stored in RFREQ_10. If a third and fourth frequency are desired, repeat the above procedure with FRQSEL[1:0]=01 and 00, respectively.

In order to additionally compensate for temperature variations, which affect the reference frequency supplied, e.g., by the XO, the delta M over T value (DELMT) value is supplied to summing circuit 315 along with the reference frequency control value RFREQ. Thus, the control value generated at the reference temperature calibration point, along with an interpolated delta as described above, is supplied to summer 315 and utilized to generate the M value. Note that other temperature calibration algorithms besides the interpolation described above may be utilized. That function, in the embodiment illustrated in FIG. 4, is performed by the control circuit 341.

Figure 8:
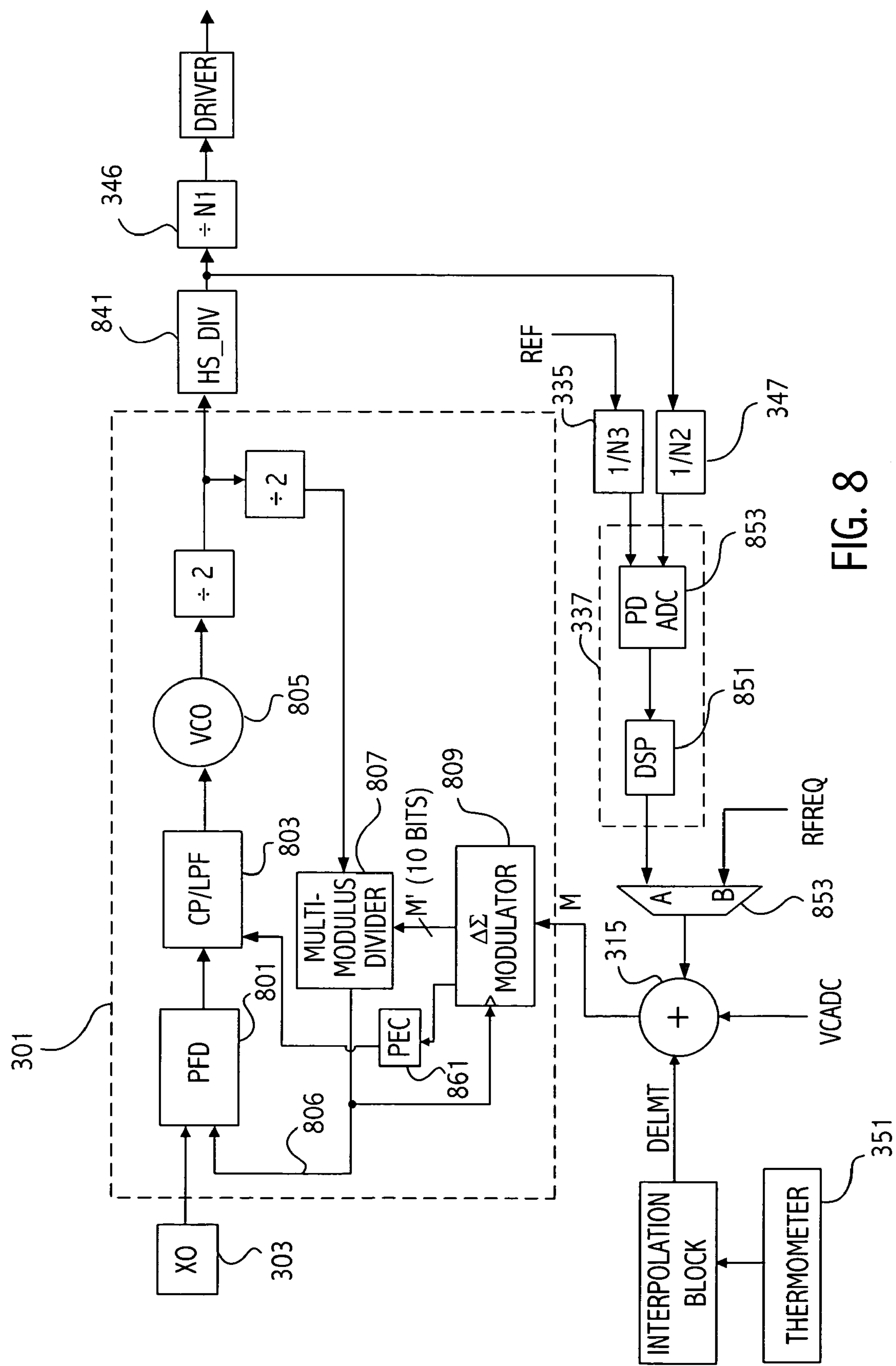
FIG. 8 illustrates an exemplary embodiment of the digitally controlled oscillator utilized in FIGS. 3 and 4.

Referring to FIG. 8, illustrated is an exemplary embodiment of the digitally controlled oscillator (DCO) 301. The crystal (or SAW) oscillator 303 supplies a timing reference to the DCO 301 and supplies one input to the phase and frequency detector 801. Phase and frequency detector 801 generates an error term of the difference between the crystal oscillator input and the feedback from the VCO 805. Note that the feedback is supplied by multi-modulus divider block 807. In the embodiment illustrated in FIG. 8, the DCO is a fractional N loop. During calibration, the DCO 301 functions as an inner loop having its feedback divider controlled by an outer loop that includes the dividers 335, 347, phase detector and analog to digital converter 853, filter 851, as well as portions of the inner loop. The inner loop or DCO 301 is a fractional N loop wherein a period of the reference clock supplied by crystal or SAW 303 is a non-integer multiple of a period of the oscillator clock signal supplied by VCO 805. Using a fractional N loop allows the use of a low cost timing reference such as a low cost crystal oscillator. During normal operation, the DCO receives a control value from summing circuit 315 based on VCADC (from ADC 311 shown in FIG. 3), DELMT, and RFREQ. Thus, the temperature compensation is achieved by adjusting the feedback loop of the DCO 301 through the divide ratio supplied to delta sigma modulator 809, which is coupled to adjust the divisor of divide block 807.

Note that the inner loop forming DCO 301 utilizes a digital loop filter to allow the loop filter to be integrated onto the integrated circuit to reduce potential additional noise sources. Further, as described above, utilization of a digital loop filter allows an accurate implementation of the loop filter that is properly matched to the corners and the order of the noise shaping function and therefore can best reduce the jitter contribution from that source.

In one embodiment, the multi-modulus divider 807 is formed by a series of dividers. Because the feedback frequency may be in the GHz range, a prescalar is used to divide the feedback signal by, e.g., 4 or 5. Subsequent division stages, e.g., a plurality of divide by 4 and/or 5 stages further divide the feedback signal to an appropriate value according to the desired divider value.

Figure 9:
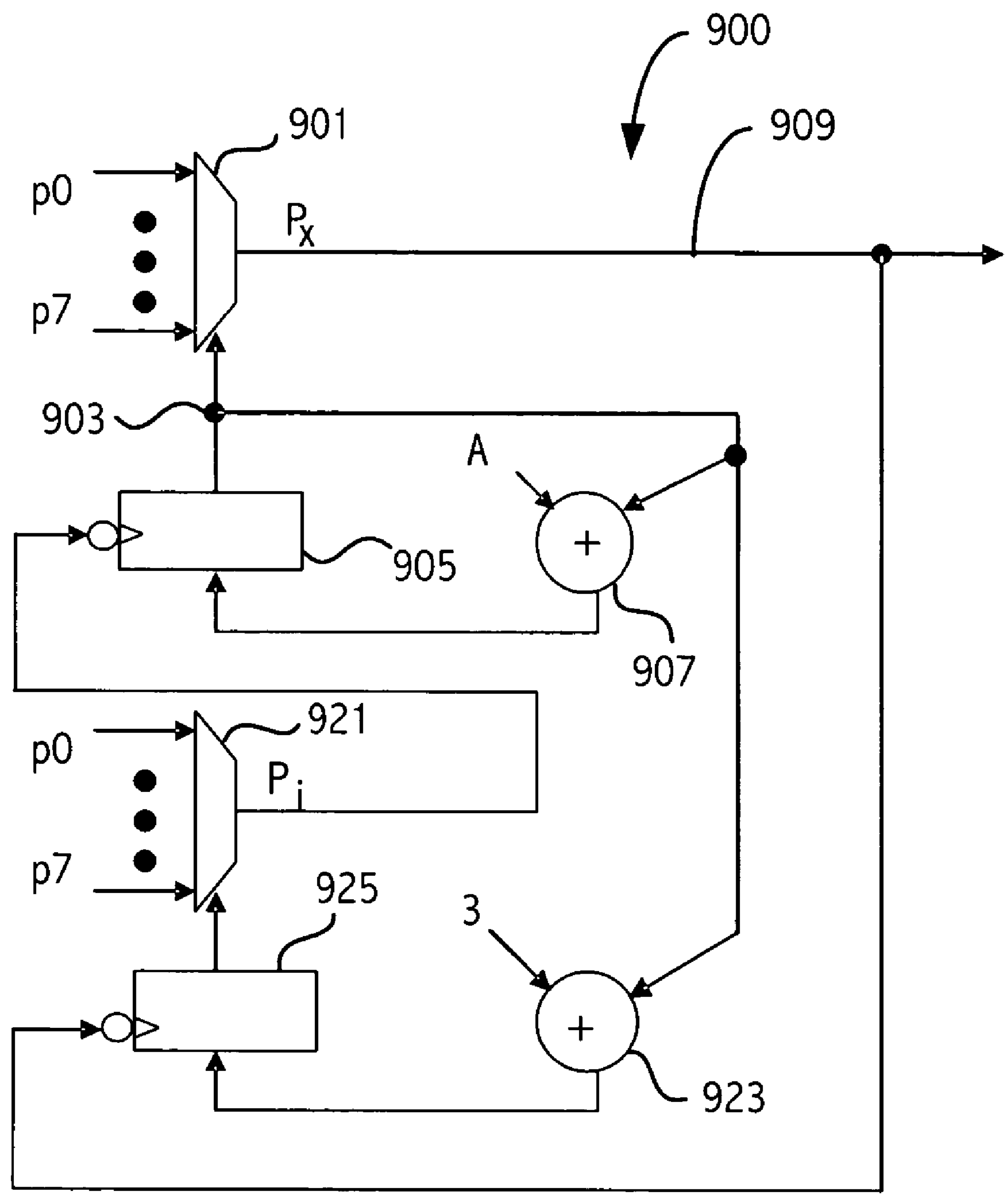
FIG. 9 illustrates a block diagram of an exemplary phase selectable divider circuit that may be utilized in the multi-modulus divider in FIG. 8.

Referring to FIG. 9 a block diagram of an exemplary phase selectable divider 900 is illustrated that may be utilized as part of the multi-modulus divider 807. Eight clock signals P0–P7 are supplied to selector circuit 901. In the illustrated embodiment, selector circuit 901 is implemented as a multiplexer. A three bit control signal 903 supplied from register 905 selects which of the clock signals P0 to P7 is output by the selector circuit. The clock signals P0–P7 have different phases. By selecting which clock signals are supplied by multiplexer 901, different frequency clock signals can be generated by the divider circuit.

Figure 10:
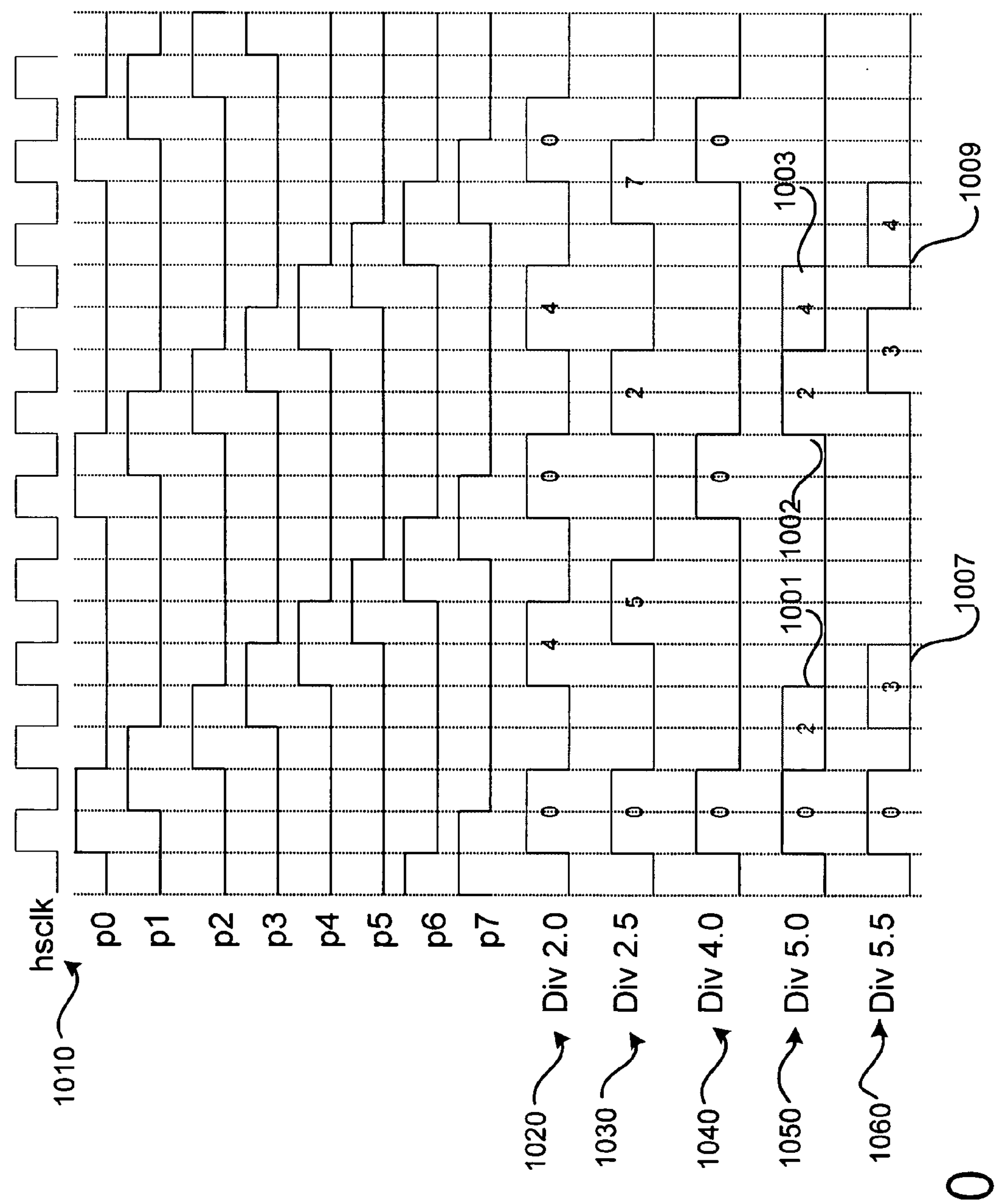
FIG. 10 illustrates operation of the phase selectable divider of FIG. 9.

Referring to FIG. 10, a timing diagram illustrates operation of the divider circuit 900. As shown in FIG. 10, the clock signals P0–P7 are derived from a clock 1010 shown as hsclk. In one embodiment hsclk 1010 is approximately 2.5 gigahertz and the clock signals P0–P7 are one fourth of clock signal hsclk, approximately 625 MHz. Referring again to FIG. 9, the divider circuit 900 selects the next pulse to be output by adding a value A to the current select signal 903 in summing circuit 907 to generate a sum that is supplied to register 905. The table below illustrates values of A supplied to summing circuit 907 to achieve various divide values.

TABLE 1

| A (mod 8) | A' (effective A) | Division Factor |
|---|---|---|
| 1 | 1 | 0.5 |
| 2 | 2 | 1.0 |
| 3 | 3 | 1.5 |
| 4 | 4 | 2.0 |
| 5 | 5 | 2.5 |
| 6 | 6 | 3.0 |
| 7 | 7 | 3.5 |
| 0 | 8 | 4.0 |
| 1 | 9 | 4.5 |
| 2 | 10 | 5.0 |
| 3 | 11 | 5.5 |

The use of the divider circuit 900 to generate a clock signal that is divided down from the hsclk signal will now be illustrated with reference to FIG. 10. Assume it is desired to divide the hsclk signal by 2.

Referring to the table above, it can be seen that in order to divide by 2 (the division factor), the appropriate value of A is 4. Assume that the currently selected clock is P0, so the select signal supplied from register 905 will be configured to select P0, e.g., using a value of 000. In order to select the next pulse output by the multiplexer, the summing circuit 407 adds the current value supplied from register 905 (which is 000) with the value of A (which is 4) and provides a sum of 4 to register 905 to select P4 as the next pulse output by multiplexer 901, as illustrated by the clock signal 1020 (Div 2.0) shown in FIG. 10. The sum circuit 907 is implemented as a modulo N summing circuit where N equals the number of clock signals supplied to multiplexer 401, which is 8 in the illustrated embodiment. With 4 as the current value of the select signals supplied by register 905, the next value supplied as the select signal is 0, which selects P0 as the next pulse to be output by the select circuit 901. That is, 4 (the value of the select signal)+4(the value of A)=0 in a modulo 8 summing circuit. A is continually added to the current select value to generate the next pulse and a sequence of pulses selected from the phases P0 and P4 is output as shown in FIG. 10 to generate an output clock signal that equals hsclk/2.

A divide by 2.5 will now be described. Assume that the currently selected clock is P0, so the select signal on control lines 903 will be configured to select P0, e.g., using a value of 000. Referring to Table 1, in order to divide by 2.5 (the division factor), the value of A is 5. The summing circuit 907 provides a sum of 5 to register 905 to select P5 as the next pulse output by multiplexer 901, as illustrated by the clock signal 1030 (Div 2.5) shown in FIG. 10. With 5 as the current value of the select signals, the next value supplied as the select signal is 2, which selects P2 as the next pulse to be output by the select circuit 901. That is, 5 (the value of the select signal)+5(the value of A)=2 in a modulo 8 summing circuit. A is added to the current select value to generate the next select value, which is supplied to the select circuit. The next pulse selected is P7.

In the general case, for the circuit shown in FIG. 9, given 8 phases of a clock, with p(n) being the phase selected at a time "n", phase selection is accomplished by p(n+1)=(p(n)+A) mod 8. FIG. 10 also shows the pulses 540, 550, 560, selected, respectively for divide by 4, 5 and 5.5.

Referring to Table 1, note that for the embodiment illustrated in FIG. 9, the first three divide values (0.5, 1.0, 1.5) are not available. Also for longer divide operations, for example, divide by 4.5, 5, or 5.5, the first pulses output in the longer divides need to be ignored. This is illustrated in FIG. 10. Thus, for example, for a divide by 5, and assuming P0 is the initial pulse out, and A=2, the first P2 pulse 1001 is ignored but the second P2 pulse is supplied by multiplexer 901. Similarly, after the second P2 pulse 1002 is supplied, the first P4 pulse 1003 is ignored. With the first pulse ignored each time, the effective value of A=9. The resultant waveform 1050 supplied on node 909 is labeled Div 5.0 in FIG. 10. Similarly, the initial pulses 1007 and 1009 shown in FIG. 10 are ignored in a divide by 5.5 as shown in waveform 1060.

Referring again to FIG. 9, in order to achieve the necessary delay for the longer divides, e.g., the divide by 5 and 5.5 shown in FIG. 10, in one embodiment a second selector circuit 921 is utilized with a second summer circuit 923 and a second register 925. A skip delay value of 3 is added to the current select value 903 in summing circuit 923. The skip delay indicates how many phase steps (each of clocks P0–P7 being a phase step) should be skipped before the select signal in register 905 is updated. As shown in FIG. 9, the output clock from multiplexer 901 on node 909 is used to update register 925 with the sum from summing circuit 923. The clock selected by multiplexer 921 is used to update the register 905. That ensures that the value of the select signals do not change until after the first pulses have been skipped for A equal to 1, 2, or 3. For example, if the currently selected clock is P0 and A=1, with a skip count of 3, register 905 is not updated until P3, thereby ensuring that the first P1 pulse is skipped. Referring to FIG. 10, a skip delay of three ensures that the undesirable pulses 1001, 1003, 1007, and 1009 are not output. Note that in some embodiments, the multiplexer 901 may be coupled to receive an input signal that is a steady state input signal, e.g., ground, in addition to the various phase sets received. In that way, the multiplexer may be selected to output no signal.

Figure 11:
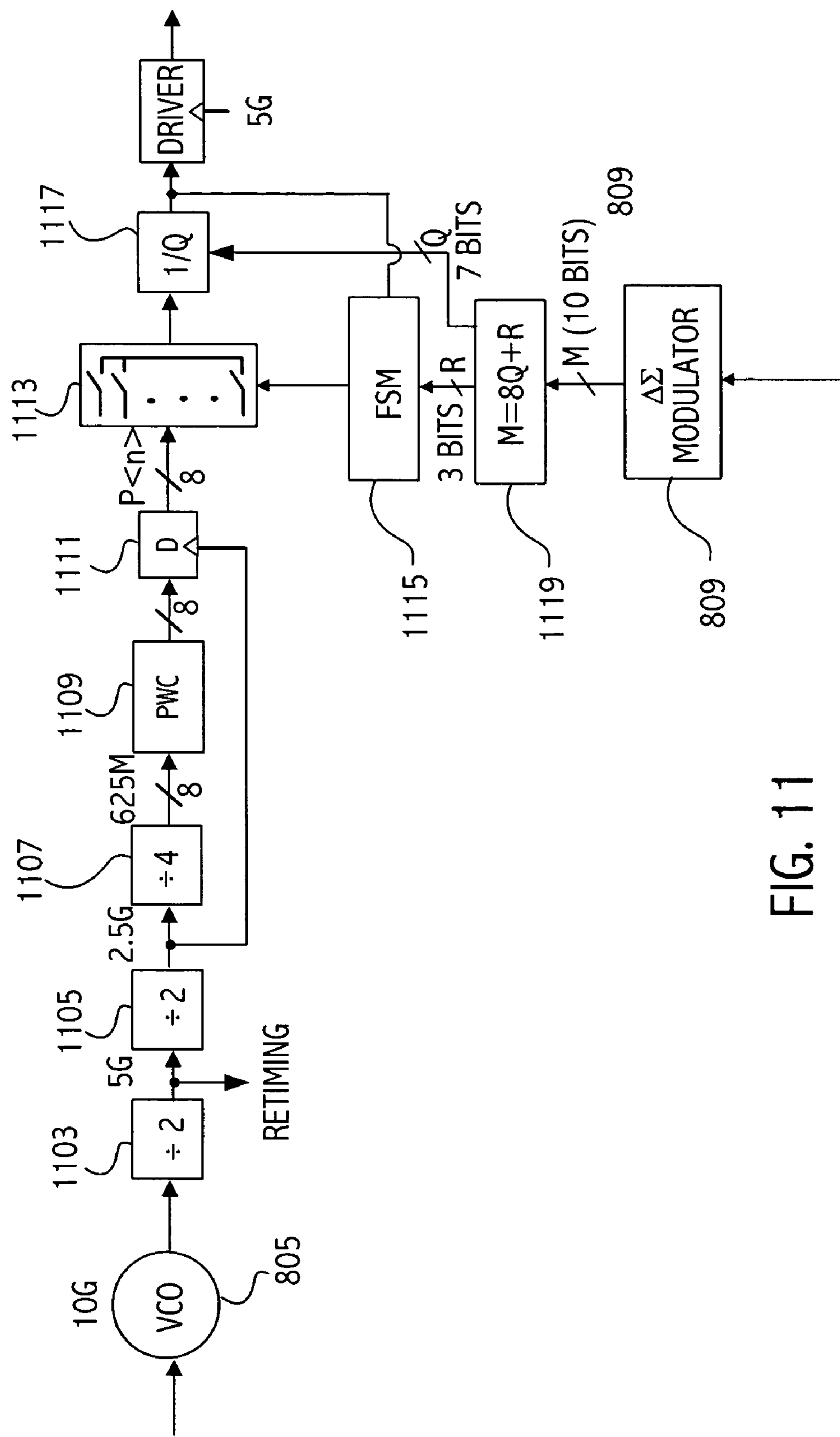
FIG. 11 illustrates an exemplary implementation of a multi-modulus divider.

FIG. 11 illustrates an embodiment of how a multi-modulus divider such as that illustrated in FIG. 9 may be utilized in the DCO 301 shown in FIG. 8. Referring to FIG. 11, a block diagram illustrates a multi-modulus programmable divider circuit according to an embodiment of the invention. The VCO 805 provides an approximately 10 GHz clock signal, which is divided down in dividers 1103 and 1105 to an approximately 2.5 GHz clock signal. In order to operate the divider at a high frequency with low power consumption, some embodiments avoid feeding control signals to the high-speed circuitry. Instead, one embodiment utilizes a minimum number of transistors in the high speed portion to save power and take advantage of the multiphase output of a divider described herein to achieve equivalent speed. The programmability is pushed into the lower frequency circuitry. The 5 GHz signal from node 1103 is fed to a cascade of two dividers, divider 1105, which is a divide-by-two and divider 1107, which is a divide-by-four phase generator that generates 8 different phases. Divider 1107 supplies pulse width controller (PWC) 1109, which in turns supplies an 8-to-1 phase selecting multiplexer 1113 through flip-flops 1111. The phase selecting multiplexer 1113 directs one of the eight (8) phases from the PWC 1109 to its output. The output of the multiplexer 1113 is used to clock a divide-by-Q counter (/Q) 1117, which generates the divider output. The output is also used to trigger a finite state machine (FSM) 1115, which implements the multiplexer control (phase selection) algorithm, e.g. as illustrated in FIGS. 9–10.

In one embodiment, as illustrated in FIG. 11, the delta sigma modulator 809 supplies a stream of integers M' to block 1119 by to provide fractional n divide capability. M' is a sequence of integers that approximates the rational number M. Note that in some embodiments, block 1119 may be incorporated into the finite sate machine 1115. Assuming the input frequency is $f_{in}$ and the output frequency is $f_{out}$, the divide ratio $M=f_{in}/f_{out}$. In one embodiment M=((9.7 GHz~11.32 GHz)/2)/(10 MHz (Xoxc)~320 MHz (SAW)). Thus, M=15.15625~566. In one embodiment the delta sigma modulator is an eight level quantizer that expands the fractional range to M−3 to M+4. The delta sigma modulator may be implemented, e.g., as a third order delta sigma modulator. Given that expansion of the fractional range of M, M ranges from approximately 12 to approximately 570. The divider circuit illustrated in FIG. 11 operates fundamentally as an integer divider with the M' value updated at a frequency varying from approximately 416 MHz for an M value of 12, to an update frequency of approximately 9 MHz for an M value of 570.

The operation of the divider described in FIG. 11 can be understood from the following arithmetic expression:

$$\begin{array}{r} Q \\ 8\overline{)M'} \\ \underline{-8Q} \\ R \end{array}$$

where Q is the quotient and R is the remainder, and M' is the divider ratio. From that arithmetic expression, the divide ratio M'=8Q+R. The divide ratio is thus split into a constant coefficient (here 8, although other numbers are of course possible) multiplied by a quotient Q, which is >=1 and a remainder (R). The R portion is implemented through the phase-selecting multiplexer 1113 being controlled by the finite state machine (FSM) 1115. Control logic 1119 receives the divide ratio M', splits it into two portions, a Q number and an R number. The Q number is sent to Q divider 1117 input bits, while the R number is used by the finite state machine 1115. The 8Q value can be understood as a coarse tuning capability, while the R value provides a finer tune capability.

The divide by 8, the constant coefficient, can be accomplished in the higher speed divide circuits 1105 and 1107. The divide by Q and the divide by R can be performed in lower speed circuitry. The divide by Q can be performed in variable divider circuit 1117, which has a much lower input frequency, thus can be implemented with low speed circuitry. The divide by R can be achieved in the phase selecting multiplexer 1113. The multiplexer 1113 chooses the phase that is R steps offset (R can be positive or negative) from the last phase in each cycle of the output, thus achieving the division factor 8Q+R. R is similar to A utilized in FIGS. 9 and 10. By varying both Q and R, flexible programmability is achieved. Various values of R may be utilized examples of which are shown below.

R=(−4, −3, −2, −1, 0, 1, 2, 3)
R=(−3, −2, −1, 0, 1, 2, 3, 4),
R=(−2, −1, 0, 1, 2, 3, 4, 5),
R=(−1, 0, 1, 2, 3, 4, 5, 6),
R=(0, 1, 2, 3, 4, 5, 6, 7)

In each R scheme shown above, there are 8 values corresponding to each phase step. The R scheme chosen determines the minimum available division ratio and the maximum input frequency at the input of Q counter. For example, comparing scheme R=(−4, −3, −2, −1, 0, 1, 2, 3) to R=(0, 1, 2, 3, 4, 5, 6, 7), the first scheme can achieve the minimum divide ratio of /3, while the second one can only achieve the minimum divide ratio of /8. However the first scheme requires the Q counter to be able to operate at a much higher frequency. It also imposes tighter timing requirement on multiplexer control signal generation compared to other R scheme. It also consumes more power and may require custom design of the digital circuitry. Operation of R=(−3, −2, −1, 0, 1, 2, 3, 4), is illustrated in FIG. 12.

Figure 12:
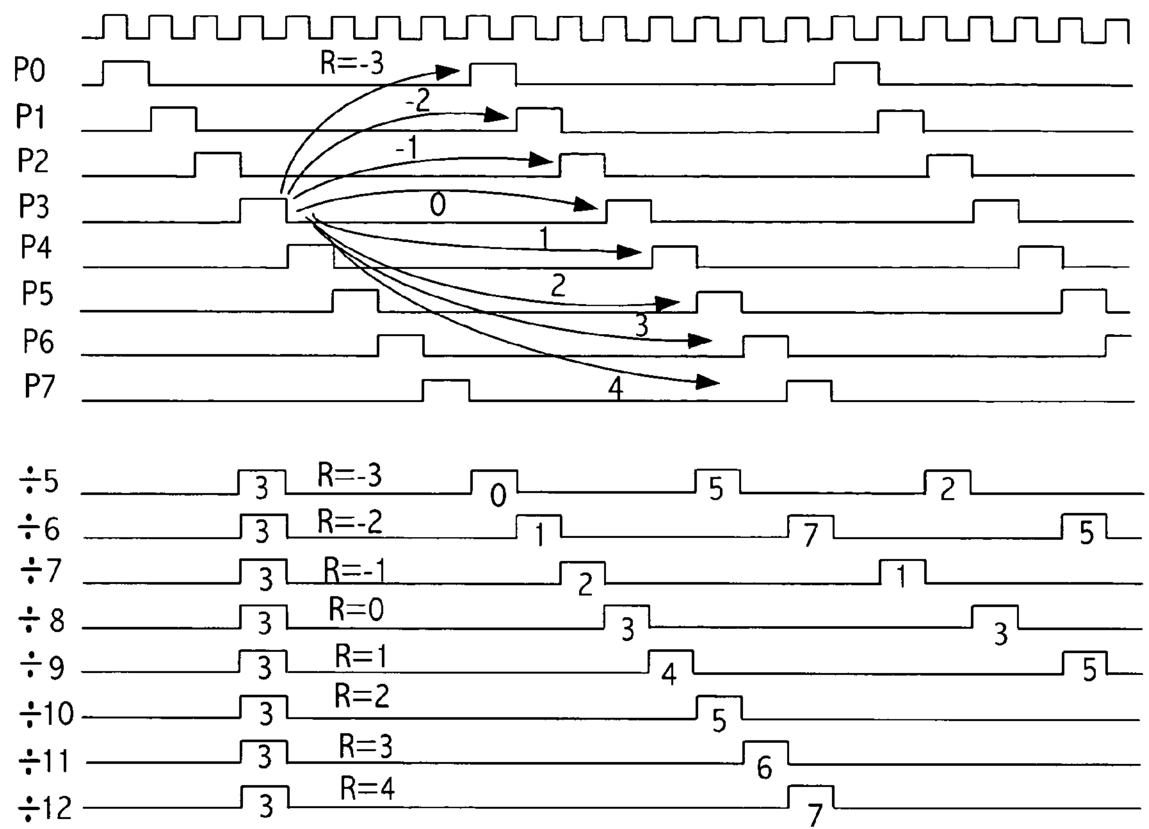
FIG. 12 illustrates operation of the multi-modulus divider shown in FIG. 11.

The top portion of FIG. 12 illustrates the input to the phase selecting multiplexer 1113, while the bottom portion of FIG. 12 illustrates the output for various divide values.

The use of the delta sigma modulator in a fractional N loop is illustrated in the following. Assume for example, that the value of M is 100 to achieve a desired nominal output frequency from DCO 301 (FIG. 3). The temperature compensation value determined by the interpolation described above may cause the value of M with temperature compensation to be 100.5. The delta sigma modulator in one embodiment provides an output having 8 different integer levels from −3 to 4, to represent the fractional portion, which values are combined with the integer portion (100) and mapped into the dividers of multi-modulus divide by N block 807. Thus, values ranging from 97 to 104 may be applied as divider values to the multi-modulus divide by N block 807. The use of the delta sigma modulator allows appropriate values to be used to average 100.5. Note that a value is generated by the divide block 807 at a rate of the XO (or other reference) clock frequency supplied on node 800.

Figure 13:
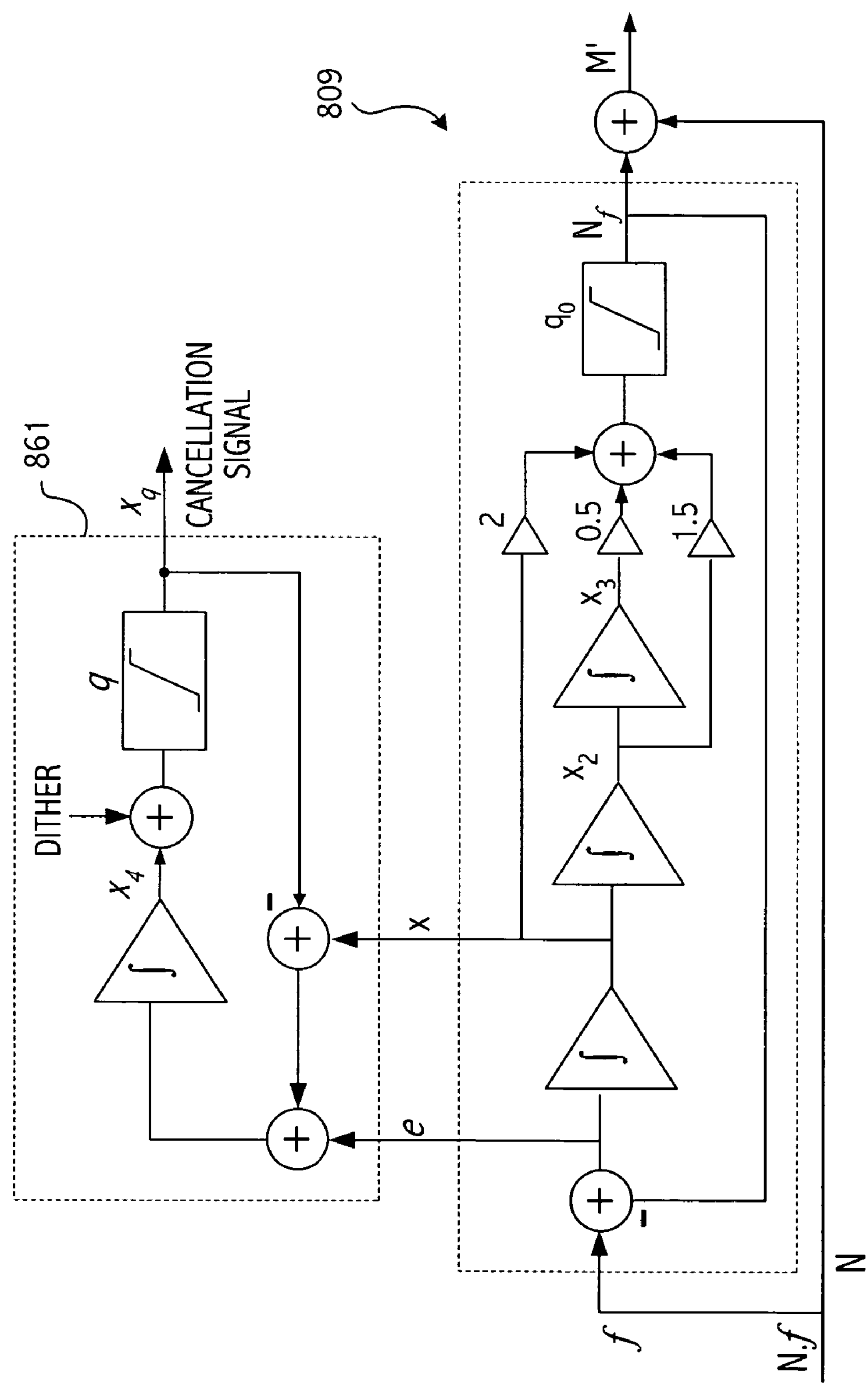
FIG. 13 illustrates the additional details of an embodiment of the delta sigma modulator and phase error cancellation circuit shown in FIG. 8.

Note that noise shaping may be used to place noise generated in the feedback divider in a frequency band that may be subsequently filtered by a low pass filter in the loop filter 803. Referring again to FIG. 8, the delta sigma modulator 809 supplies a stream of integers that approximates and averages the divide ratio desired. That introduces phase errors that can be compensated by the phase error correction logic 861. An embodiment of delta sigma modulator 809 is shown in FIG. 13. Delta sigma medulator receives as the divide control value M=N.f, where N is the integer portion of M and f is the fractional portion. The phase error correction logic 861 generates a phase error correction signal. Additional details on phase error correction can be found in the patent application Ser. No. 10/878,089, filed on Jun. 28, 2004, entitled "Phase Error Correction", naming D. Frey as inventor, which application is incorporated by reference herein.

Note that the terms "pin" and "terminal" as used herein are intended to refer to any kind of electrical connection provided on a package or integrated circuit such as a pin on a package or a contact pad on an integrated circuit. The term input/output (I/O) terminal (or pin) is intended to mean either a terminal that functions as an input, an output or both.

Thus, various embodiments have been described for temperature compensation. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An integrated circuit comprising:

a phase-locked loop circuit including a divider circuit in a feedback path of the phase-locked loop circuit;

wherein a control value supplied to control the divider circuit is adjusted according to a detected temperature; and an arithmetic circuit coupled to generate the supplied control value, the arithmetic circuit coupled to receive at least a first and second control value, the first control value being a reference control value fixed over temperature, the second control value being an adjustment to the reference control value determined according to the detected temperature.

2. The apparatus as recited in claim 1 wherein the supplied control value is a divide ratio of the divider circuit.

3. The integrated circuit as recited in claim 1 wherein the supplied control value is a rational number.

4. The integrated circuit as recited in claim 1 wherein the supplied control value is supplied as a digital value.

5. The integrated circuit as recited in claim 3 wherein the supplied control value has a fractional component.

6. The integrated circuit as recited in claim 1 wherein the divider circuit includes a multi-modulus divider.

7. The integrated circuit as recited in claim 1 wherein the integrated circuit includes a temperature detector supplying the detected temperature.

8. The integrated circuit as recited in claim 1 wherein the integrated circuit includes an interpolator to interpolate between stored temperature compensation values according to the detected temperature.

9. The integrated circuit as recited in claim 1 further comprising a delta sigma modulator circuit coupled to receive the supplied control value adjusted according to the detected temperature and coupled to supply a sequence of integers to the divider circuit that approximates the control value.

10. The integrated circuit as recited in claim 1 wherein the first control value is determined according to a value stored in non-volatile memory.

11. The integrated circuit as recited in claim 1 wherein the arithmetic circuit is further coupled to sum a representation of a voltage present on an input terminal of the integrated circuit.

12. The integrated circuit as recited in claim 11 wherein the representation of the voltage present on the input terminal is digital.

13. The integrated circuit as recited in claim 1 further comprising non-volatile storage storing temperature compensation values used to adjust the supplied control value according to the detected temperature.

14. The integrated circuit as recited in claim 13 further comprising interpolation logic coupled to provide a temperature compensation value by interpolating between the stored temperature compensation values to generate a temperature compensation value used to adjust the supplied control value.

15. A method of compensating for temperature variation in an electronic device comprising:

detecting a temperature;

generating a divide ratio of a feedback portion of a phase-locked loop according to the detected temperature to adjust an output of the phase-locked loop and thereby compensate for the temperature variation; and wherein generating the divide ratio includes, arithmetically combining at least a first control value and a second control value, the first control value being a reference control value fixed over temperature, and the second control value being an adjustment to the reference control value determined according to the temperature.

16. The method as recited in claim 15 further comprising varying a divider value in the feedback portion of the phase-locked loop over a time period to average the divide ratio aver the time period, the divide ratio being determined at least in part according to the detected temperature.

17. The method as recited in claim 15 wherein the divide ratio is a digital value.

18. The method as recited in claim 17 wherein the divide ratio is a rational number including a fractional component and the fractional component is modulated by the delta sigma modulator.

19. The method as recited in claim 15 further comprising generating the divide ratio for the feedback portion using one or more stored temperature adjustment values.

20. The method as recited in claim 19 wherein the temperature adjustment values are stored in a nonvolatile memory.

21. The method as recited in claim 19 further comprising interpolating between the stared temperature adjustment values to determine a temperature adjustment value and using the temperature adjustment value to adjust the divide ratio of the feedback portion.

22. The method as recited in claim 15 wherein generating the divide ratio further comprises arithmetically combining the first and second control value with a third control value, the third control value corresponding to a voltage present on an input terminal to control oscillator output.

23. A method of compensating for temperature variation in an electronic device comprising:

detecting a temperature;

generating a divide ratio of a feedback portion of a phase-locked loop according to the detected temperature to adjust an output of the phase-locked loop and thereby compensate for the temperature variation, and wherein generating the divide ratio comprises arithmetically combining a first control value and a second control value, the first control value corresponding to a voltage present on an input terminal, and the second control value being an adjustment value determined according to the temperature.

24. The method as recited in claim 23 wherein generating the divide ratio further comprises arithmetically combining the first and second control value with a third control value, the third control being a center frequency control value fixed over temperature setting a center frequency of the output of the phase-locked loop.

25. An apparatus comprising:

means for detecting a temperature;

means coupled to the means for detecting a temperature, for modifying an output of a phase-locked loop according to the detected temperature by adjusting a feedback path of the phase-locked loop and thereby compensating for temperature variations; and wherein the means for modifying includes an arithmetic circuit coupled to generate a control value, the arithmetic circuit coupled to receive at least a first and second control value, the first control value being a reference control value fixed over temperature, the second control value being an adjustment to the reference control value determined according to the detected temperature.

26. The apparatus as recited in claim 25 further comprising a divider circuit in the feedback path having a divider value determined according to the detected temperature.

* * * * *